US008861228B2

(12) United States Patent
Berton et al.

(10) Patent No.: US 8,861,228 B2
(45) Date of Patent: Oct. 14, 2014

(54) HIGH VOLTAGE CONTROLLER WITH IMPROVED MONITORING AND DIAGNOSTICS

(75) Inventors: Farhad Berton, Landshut (DE); Josef Braun, Pfaffenberg (DE)

(73) Assignee: Durr Systems GmbH, Bietigheim-Bissingen (DE)

( * ) Notice: Subject to any disclaimer, the term of this patent is extended or adjusted under 35 U.S.C. 154(b) by 115 days.

(21) Appl. No.: 12/960,849

(22) Filed: Dec. 6, 2010

(65) Prior Publication Data

US 2011/0164439 A1   Jul. 7, 2011

Related U.S. Application Data

(60) Provisional application No. 61/267,186, filed on Dec. 7, 2009.

(51) Int. Cl.
*H02J 1/00* (2006.01)
*H02H 7/00* (2006.01)
*H02M 7/538* (2007.01)
*B05B 5/10* (2006.01)

(52) U.S. Cl.
CPC ............. *H02M 7/53806* (2013.01); *B05B 5/10* (2013.01)
USPC .................................. 363/15; 363/25; 363/51

(58) Field of Classification Search
USPC ........... 363/19, 21.01, 21.09, 21.1, 21.17, 22, 363/23, 24, 25, 26, 97, 15, 16, 50, 51, 363/56.06, 56.07, 56.08, 56.09, 56.1, 56.11
See application file for complete search history.

(56) References Cited

U.S. PATENT DOCUMENTS

| | | | | |
|---|---|---|---|---|
| 2,886,763 A * | 5/1959 | Zelina | .............................. | 322/25 |
| 3,818,307 A * | 6/1974 | Hamilton et al. | ................ | 363/65 |
| 5,521,809 A * | 5/1996 | Ashley et al. | ................... | 363/71 |
| 5,831,405 A * | 11/1998 | Massie | ........................... | 318/471 |
| 5,956,239 A * | 9/1999 | Giacomini | ...................... | 363/17 |
| 6,009,000 A * | 12/1999 | Siri | ............................. | 363/21.09 |
| 6,339,538 B1 * | 1/2002 | Handleman | ..................... | 363/95 |
| 6,370,039 B1 * | 4/2002 | Telefus | ............................ | 363/15 |
| 7,148,659 B2 * | 12/2006 | Lanni | ............................ | 363/142 |
| 7,165,542 B2 * | 1/2007 | Masters et al. | ................ | 123/609 |
| 7,440,301 B2 * | 10/2008 | Kirchmeier et al. | ........... | 363/132 |
| 7,531,970 B2 * | 5/2009 | Yu et al. | ......................... | 315/291 |

(Continued)

FOREIGN PATENT DOCUMENTS

JP             08070580 A  *  3/1996

*Primary Examiner* — Gary L Laxton
*Assistant Examiner* — Alex Torres-Rivera
(74) *Attorney, Agent, or Firm* — Bejin Bieneman PLC

(57) ABSTRACT

A high voltage controller configured to drive a high voltage generator. The high voltage controller includes a voltage select input and a current select input, an actual voltage input and an actual current input. First circuitry is configured to generate an alternating current (AC) drive signal. Second circuitry configured to generate a direct current (DC) drive signal. Closed loop control circuitry is configured to adjust the DC drive signal based on at least one of the voltage select and current select inputs and at least one of the actual voltage and actual current inputs. The first circuitry may include a push-pull circuit. The second circuitry may include a pulse width modulation (PWM) controller. A high voltage generator may be coupled to the AC and DC drive signals. The high voltage generator may include a high voltage transformer having a pair of primary windings and center tap. The AC drive signal may be coupled to the primary windings and the DC drive signal may be coupled to the center tap.

25 Claims, 19 Drawing Sheets

(56) References Cited

U.S. PATENT DOCUMENTS

| | | | |
|---|---|---|---|
| 7,602,158 B1 * | 10/2009 | Iacob | 323/231 |
| 7,974,109 B2 * | 7/2011 | Kesterson et al. | 363/21.16 |
| 2001/0020653 A1 | 9/2001 | Wilson et al. | |
| 2004/0085784 A1 | 5/2004 | Salama et al. | |
| 2007/0176584 A1 * | 8/2007 | Chen | 323/282 |
| 2008/0143179 A1 * | 6/2008 | Rutherford | 303/160 |

* cited by examiner

Figure 4b

HIGH VOLTAGE CONTROLLER WITH IMPROVED MONITORING AND DIAGNOSTICS

CROSS REFERENCE TO RELATED APPLICATIONS

This application claims the benefit of U.S. Provisional Application No. 61/267,186, filed Dec. 7, 2009, contents of which is hereby incorporated by reference herein.

FIELD OF INVENTION

This application is related to high voltage control systems. More particularly, this application is related to high voltage control systems for use in connection with electrostatic applications including spray systems and filtration systems.

BACKGROUND

Typical electrostatic spray systems utilize a high voltage power supply to electrically charge a coating material (e.g., powder or paint). Charged atomized particles are discharged from the electrostatic spray gun and are directed towards an oppositely charged object to be painted. The paint is then attracted to the object yielding an even coat with an increased percentage of coating material that actually sticks to the object.

An electrostatic spray system typically includes one or more high voltage generators with associated control electronics. In some cases, the high voltage generator is located inside a spray booth and the control electronics are located outside of the spray booth. In other cases, the high voltage generator may be located in the spray gun. The controller is typically located outside of the gun due to the size and complexity of control electronics. The controller typically provides control signaling for the high voltage generator. Such signaling may be used to set the working parameters of the high voltage generator and may also provide safety controls.

It would be desirable reduce the size of the control electronics so that they may be collocated in the spray gun along with the high voltage generator. It would also be desirable to provide enhanced control and diagnostics of the high voltage system.

SUMMARY

A high voltage controller configured to drive a high voltage generator. The high voltage controller includes a voltage select input and a current select input, an actual voltage input and an actual current input. First circuitry is configured to generate an alternating current (AC) drive signal. Second circuitry configured to generate a direct current (DC) drive signal. Closed loop control circuitry is configured to adjust the DC drive signal based on at least one of the voltage select and current select inputs and at least one of the actual voltage and actual current inputs. The first circuitry includes a push-pull circuit. The second circuitry includes a pulse width modulation (PWM) controller. A high voltage generator may be coupled to the AC and DC drive signals. The high voltage generator may include a high voltage transformer having a pair of primary windings and center tap. The AC drive signal may be coupled to the primary windings and the DC drive signal may be coupled to the center tap.

The high voltage controller may include soft start circuitry coupled to at least one input of the PWM controller. Safe shutdown circuitry may be coupled to an on/off input. The safe shutdown circuitry may be configured to de-energize at least one power supply pin of the PWM controller based on the on/off input. The high voltage controller may include a diagnostic mode select input and a plurality switches. Each switch may be configured to select a diagnostic input signal based on the diagnostic mode select input. The high voltage controller may also include at least one temperature sensor coupled to over temperature alarm circuitry. Over voltage and over current alarm circuitry may also be provided. A rectangular signal generator may be provided to generate an output signal having an output frequency that is mapped to a maximum current capability of the high voltage generator.

The high voltage controller may include a microcontroller. The microcontroller may be configured to generate the DC drive signal. The microcontroller may be configured to provide closed loop control and adjust the DC drive signal based on at least one of the voltage select and current select inputs and at least one of the actual voltage and actual current inputs. The microcontroller may be configured to adjust at least one of an output frequency and a duty cycle of the AC drive circuitry (e.g., push-pull circuit) based on the actual current input. The high voltage controller may include a serial interface configured to connect with an external computer. The serial interface may be configured to operate under at least on of a CAN, PROFIBUS or SERCOSIII protocol.

The microcontroller may be configured to limit a slope of the DC drive signal based on a predefined threshold and the actual voltage input. The microcontroller may also be configured to limit a slope of the DC drive signal based on a predefined threshold and the actual current input. The microcontroller may be configured to provide at least one of a voltage controlled mode, current controller mode or a combined voltage and current controller mode based on at least one of the voltage select input or the current select input.

BRIEF DESCRIPTION OF THE DRAWINGS

A more detailed understanding may be had from the following description, given by way of example in conjunction with the accompanying drawings wherein:

FIGS. 4a and 4b are a block diagram of a PWM controller and high voltage transformer supply voltage circuitry;

DETAILED DESCRIPTION

Figure 1:
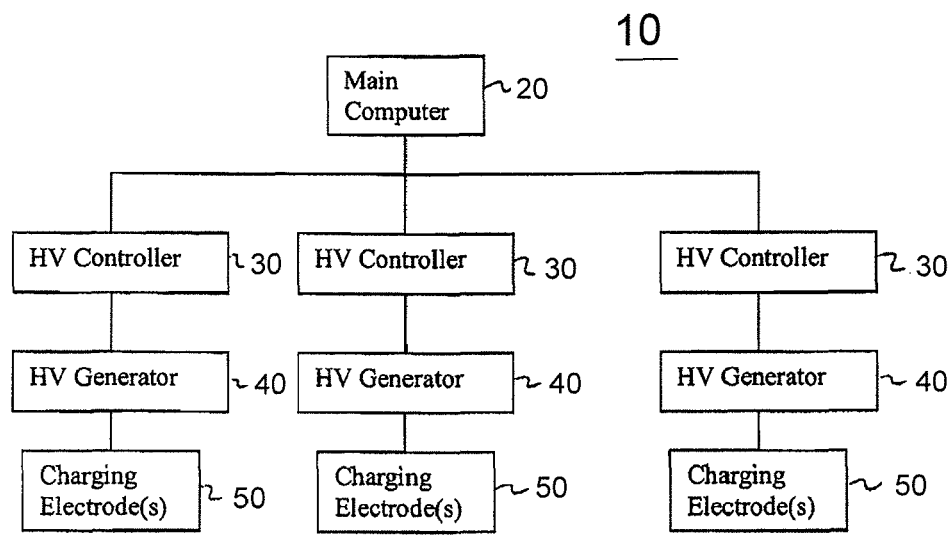
FIG. 1 is a basic block diagram of a high voltage spraying system.

FIG. 1 is a basic block diagram of a high voltage spraying system 10. It is understood that various components of this system may be used in other electrostatic applications including air filtration systems and the like. The high voltage spraying system includes a main computer 20 coupled to one or more high voltage controllers 30. Each high voltage controller 30 is coupled to a high voltage generator 40. The output of the high voltage generator 40 is coupled to one or more charging electrodes 50 (e.g., corona electrodes).

It is understood that a charging electrode 50 may be disposed in an electrostatic spray gun. Such guns are used to apply protective coatings to a wide variety of industrial and commercial products. Typically, a finely divided powder is transported through a spray head while entrained in a fluid stream (e.g., air or gas). The fluidized stream comes into contact with an electrostatic field generated by the charging electrode 50. This imparts a charge to the particles in the fluidized stream. The charged fluidized stream is then discharged from the spray head towards an object to be coated. It is also understood that the charging electrode 50 may form part of an electrostatic filtration system or other electrostatic based equipment.

Main computer 20 generally controls the operation of several high voltage spraying or filtering lines. The main computer is typically responsible for high level monitoring and control of the system. Low level functions are carried out by the high voltage controller as discuss in detail below.

Figure 2:
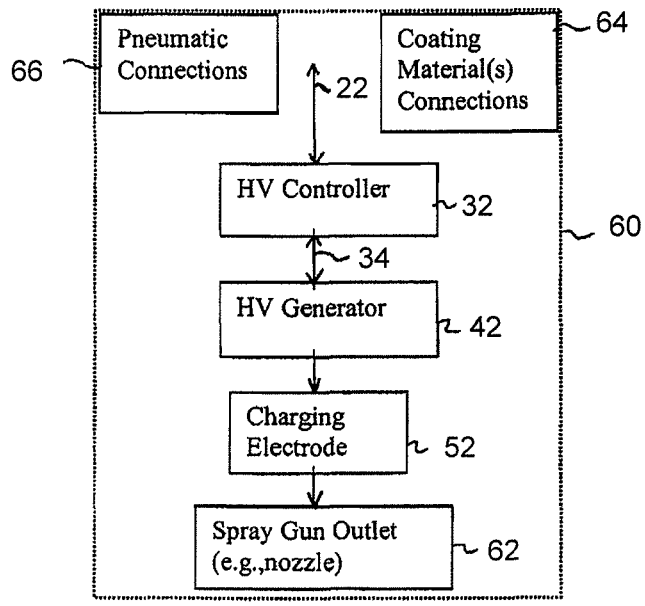
FIG. 2 is a block diagram of an embodiment of an electrostatic spray gun.

FIG. 2 is a block diagram of an embodiment of an electrostatic spray gun 60. The spay gun 60 has a connection to a supply of coating material(s) shown generally by block 64. It is understood that various feed equipment may be used to supply the spray gun 60 with suitable coating materials. The spray gun 60 also has various pneumatic connections shown generally by block 66. It is also understood that various pneumatic equipment may be used to supply the spray gun with a suitable supply of air or gas for use in the spraying process. The spray gun 60 has a charging electrode 52 (e.g., corona wire) coupled to the output of high voltage generator 42. The charging electrode is generally disposed in a flow path such that a charged fluidized stream is discharged from the spray gun outlet 62.

In this example, the high voltage controller 32 and the high voltage generator are both located within the spray gun 60. The main computer 20 is coupled to the high voltage controller 32 via one or more communication lines represented by line 22. The connection between the high voltage controller 32 and the main computer 20 may be implemented with analog and/or digital circuitry as discussed in detail below. The high voltage controller 32 is coupled to the high voltage generator via a plurality of lines represented by line 34. These connections are also discussed in detail below.

Figure 3A:
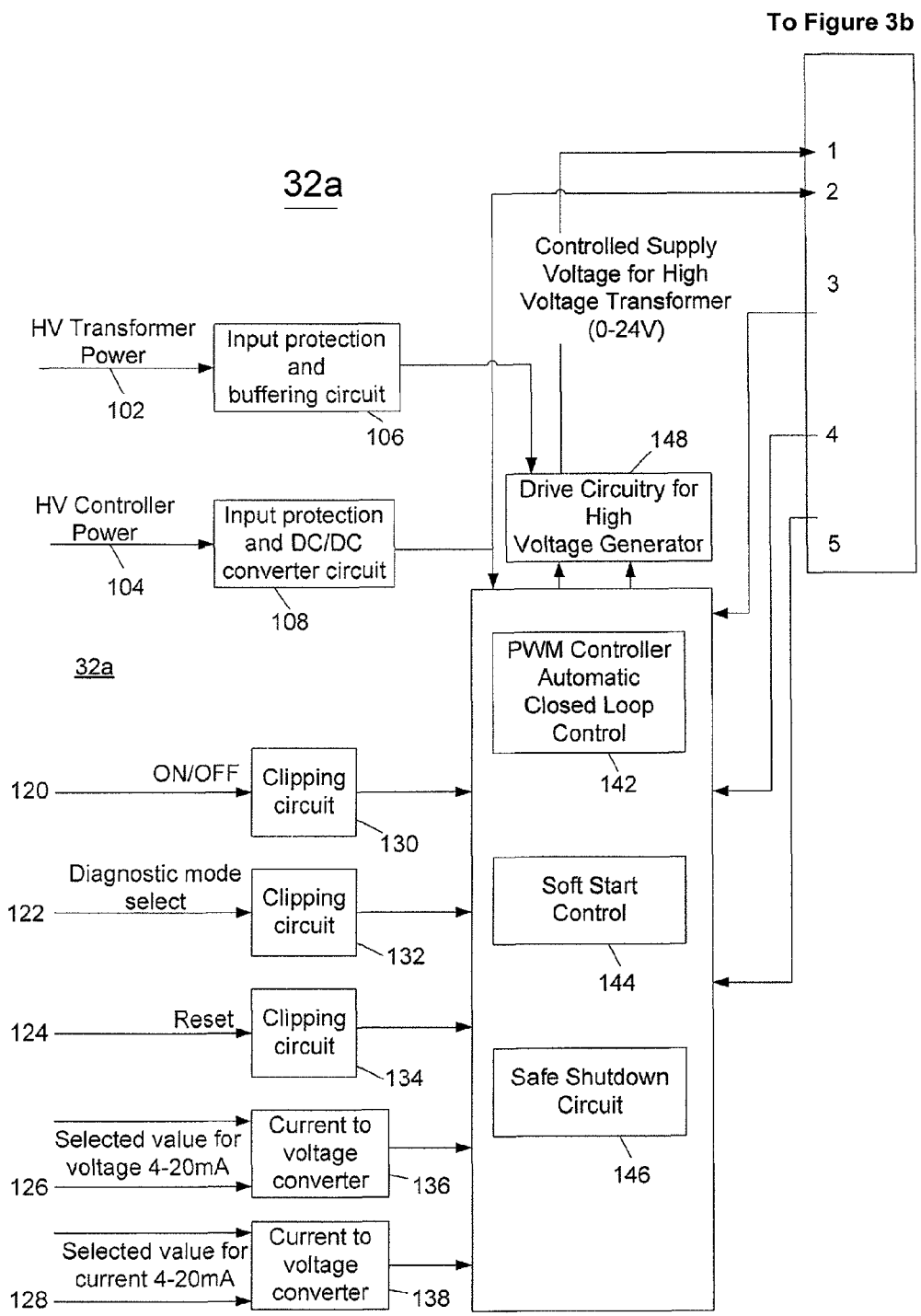
FIGS. 3a, 3b and 3c are a block diagram of an embodiment of a high voltage controller and high voltage generator.
Figure 3B:
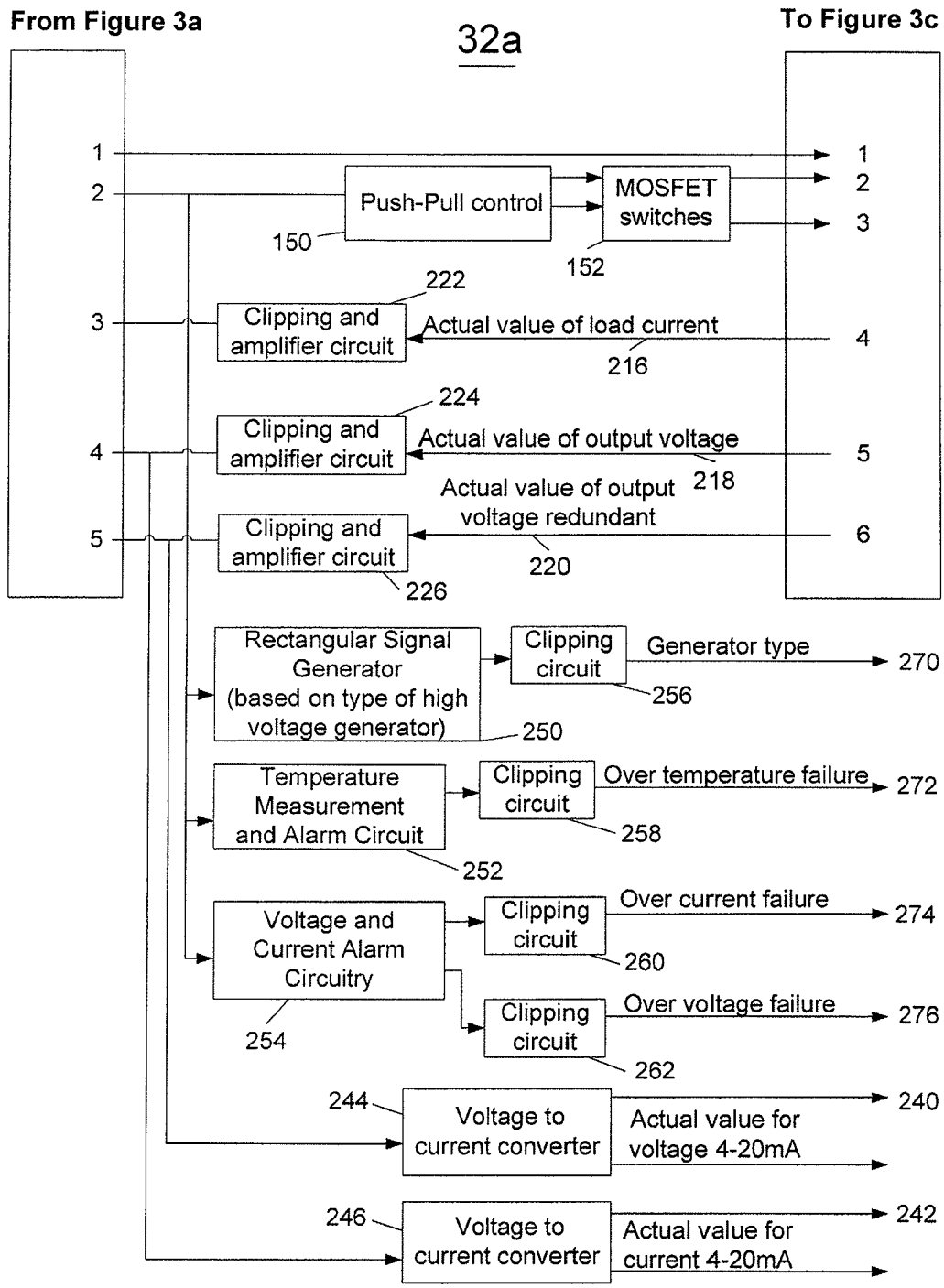
Figure 3C:
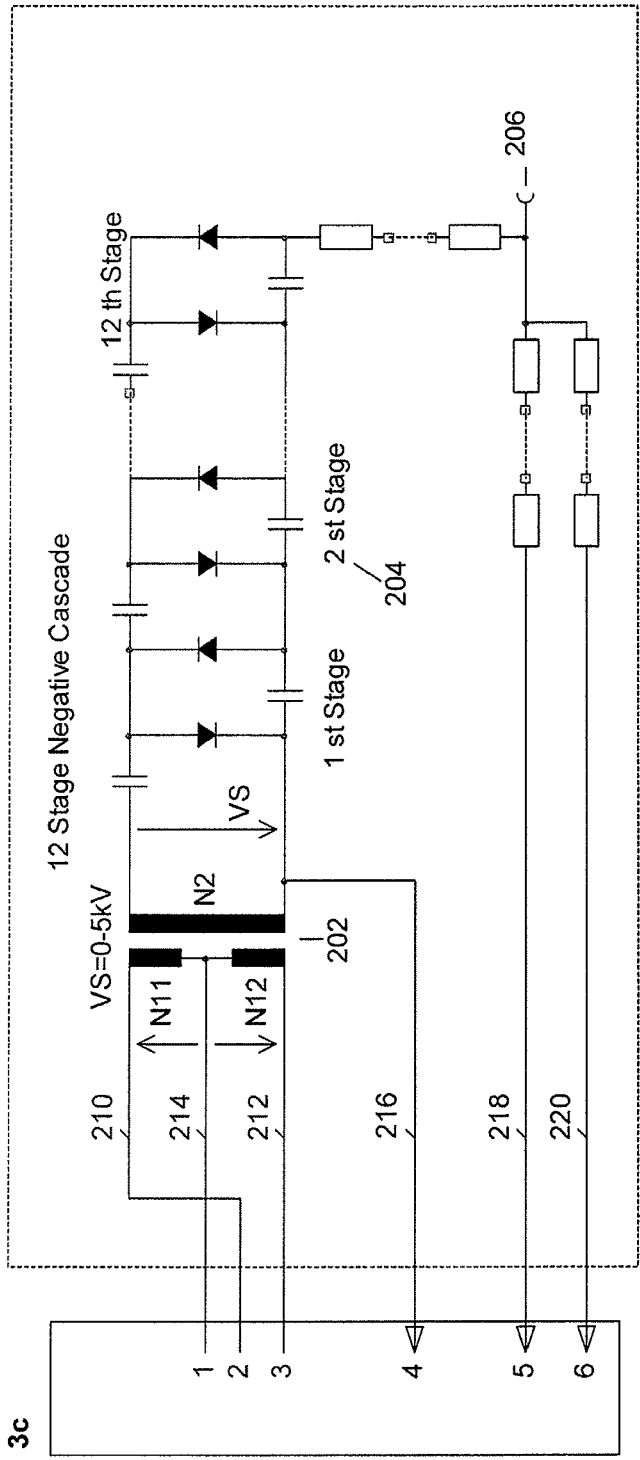

FIGS. 3a, 3b and 3c are a block diagram of an embodiment of a high voltage controller 32a and high voltage generator 42a. Among other things, the high voltage controller 32a provides voltage and current control of the high voltage generator 42a. The high voltage generator includes a high voltage transformer 202 and a voltage multiplier 204. In this example, the voltage multiplier 204 is implemented via a capacitor-diode network or cascade. It is understood that a variety of voltage multipliers configurations may be used. In general, the output of the voltage multiplier 206 drives one or more charging electrodes (not shown).

The high voltage controller 32a has power inputs shown generally by input lines 102 and 104. In this example, the power for the high voltage transformer 202 is provided via input protection and buffering circuitry as shown by block 106. Power for the high voltage controller circuitry is provided via input protection and DC/DC converter circuitry as shown by block 108. It is understood that a variety of power configurations may be used.

The high voltage controller 32a has several inputs as shown by reference numbers 120-128. Some or all of these inputs may be driven by a main computer. It is understood that a variety of signaling may be used for inputs 120-128. It is also understood that one or more interfaces may be required to convert main computer outputs into a suitable input for the high voltage controller 32a.

An On/Off input 120 is provided via clipping circuit 130. The On/Off input 120 is used to energize and de-energize the high voltage controller 32a circuitry and the high voltage generator 42a. A diagnostic mode select input 122 is provided via clipping circuit 132. The diagnostic mode select input 122 is used to initiate a self test of the high voltage controller 32a and the high voltage generator 42a. A more detailed description of self test mode is set out below. A reset input 124 is provided via clipping circuit 134. The reset input 124 is used to reset the high voltage controller 32a circuitry. Voltage select input 126 and current select input 128 are provided via current to voltage converters 136 and 138. These inputs generally select the operating parameters of the high voltage generator 42a.

The high voltage controller 32a provides voltage and current control of the high voltage generator 42a. This is accomplished via a pulse width modulation (PWM) controller and closed loop control circuitry. This functionality is shown generally by block 142. The output of the PWM controller is coupled to drive circuitry 148 which ultimately drives the high voltage transformer via center tap 214. Such circuitry may be implemented in analog and/or digital circuitry as discussed in more detail below. Voltage select input 126 and current select input 128 provide selected values for the voltage and current at the output of the high voltage generator 42a. Based on the voltage select input and current select input values, the high voltage controller 32a may operate in one of three modes: 1) voltage controlled mode, 2) current controlled mode or 3) combined voltage and current controlled mode.

In this example, the voltage select input 126 and current select input 128 are current based inputs utilizing a 4-20 mA interface. There is a linear relationship between a specific input current value and the output of the high voltage generator 42a. The mapping for the voltage select input 126 current value and the high voltage output is set out in Table 1 below:

TABLE 1

| Voltage Select Input/mA | High Voltage Output/kV |
|---|---|
| 4 | 0 |
| 5 | 10 |
| 6 | 20 |
| 7 | 30 |
| 8 | 40 |
| 9 | 50 |
| 10 | 60 |
| 11 | 70 |
| 12 | 80 |
| 13 | 90 |

TABLE 1-continued

| Voltage Select Input/mA | High Voltage Output/kV |
|---|---|
| 14 | 100 |
| 15 | 110 |
| 16 | 120 |

In this example, the maximum output voltage is 120,000 volts (120 kV). The high voltage generator 42a will produce 120 kV at output 206 when the voltage select input 126 is set to 16 ma. If the voltage select input 126 is set to 4 ma, the high voltage generator 42a will produce 0 volts.

In this example, the high voltage controller 32a may operate with three different high voltage generator types, each having different load current capabilities (e.g., 500 μA, 200 μA and 100 μA). An example mapping for the current select input 128 current value and the load current for each type of high voltage generator is set out in Table 2 below:

TABLE 2

| Current Select Input/mA | Load Current/μA (500 μA HV Generator) | Load Current/μA (200 μA HV Generator) | Load Current/μA (100 μA HV Generator) |
|---|---|---|---|
| 4 | 0 | 0 | 0 |
| 5 | 40 | 20 | 10 |
| 6 | 80 | 40 | 20 |
| 7 | 120 | 60 | 30 |
| 8 | 160 | 80 | 40 |
| 9 | 200 | 100 | 50 |
| 10 | 240 | 120 | 60 |
| 11 | 280 | 140 | 70 |
| 12 | 320 | 160 | 80 |
| 13 | 360 | 180 | 90 |
| 14 | 400 | 200 | 100 |
| 15 | 440 | 220 | 110 |
| 16 | 480 | 240 | 120 |
| 16.5 | 500 | 250 | 125 |

As discussed above, the high voltage controller has three basic modes of operation. For voltage controlled mode, the voltage select input 126 is set to 0 (4 mA). The current select input 128 is set to the desired load current. Assume for example a 100 μA high voltage generator is used and the current select input 128 is set to 9 mA. The high voltage controller will vary the high voltage generator output voltage such that a 50 μA load current is maintained.

For current controlled mode, the current select input 128 is set to 0 (4 mA). The voltage select input 126 is set to the desired output voltage. Assume for example the voltage select input 126 is set to 12 mA. The high voltage controller will vary the high voltage generator output voltage such that 80 kV is maintained at the load.

For voltage and current controlled mode, the voltage select input 126 and the current select input 128 are set to the desired values. The high voltage controller will vary the high voltage generator output voltage such the selected voltage and current set points are maintained at the load. Assume for example the voltage and current select inputs are set to 70 kV and 40 μA. Depending on the conditions at the load, the high voltage generator will achieve either the selected voltage or the selected current.

The high voltage controller 32a also includes a push pull control circuit as shown at block 150. This circuitry is used to drive the high voltage transformer 202. In this example, the input of high voltage transformer 202 has two outer legs 210, 212 connected to windings N11 and N12. The input of high voltage transformer 202 also has a center tap 214 coupled to the junction of the two windings N11 and N12. Push pull control circuitry 150 drives the outer legs of the high voltage transformer 210, 212 via MOSFET switches 152. A more detailed discussion of the push pull control circuitry is set out below. As noted above, the output of the PWM controller 142 is coupled to drive circuitry 148 which ultimately drives the high voltage transformer via center tap 214. In this example, the pull control circuitry 150 has a fixed output. Actual control of the high voltage output is accomplished by varying the output of PWM controller 142 and the drive signal at the center tap 214 of the high voltage transformer 42a.

Feedback control is provided by using voltage and current feedback signals generated at the output of the high voltage generator 42a. The PWM controller 142 uses the feedback signals to monitor the high voltage output and load current and provide automatic closed loop control. In this example, the actual load current is represented by line 216. The output voltage is redundantly sampled. Actual output voltage 1 is represented by line 218, actual output voltage 2 is represented by line 220. These feedback signals are clipped and amplified so that they may be input into the PWM controller 142 as shown by blocks 222, 224 and 226.

The high voltage controller 32a also includes several safety features including soft start control circuitry 144. This circuitry provides a gradual increase in voltage at the output 206 of the high voltage generator 42a. Safe shutdown circuitry is also provided as shown by block 146. This circuitry provides immediate power down of the critical system components so that the high voltage generator is de-energized quickly upon a power off signal. These aspects are discussed in more detail below.

The high voltage controller 32a also generates several outputs including a 4-20 mA representation of the output voltage and load current as shown by reference number 240 and 242. These outputs are generated via voltage to current converters 244 and 246. These outputs may be coupled to main computer 20 and may be used for a variety of purposes.

The high voltage controller 32a includes temperature measurement circuitry and alarm circuitry 252 which monitors the temperature of the high voltage generator 42a and the high voltage controller 32a. Such measurement circuitry may be implemented using well known techniques. In general, the output of a temperature sensor is monitored and compared to a maximum temperature threshold value. If the threshold is exceeded, an alarm signal is generated. The output of temperature measurement circuitry and alarm circuitry 252 is coupled to a clipping circuit 258 and output as shown by reference number 272. The high voltage controller 32a includes over voltage and over current alarm circuitry 254. Such measurement circuitry may be implemented using well known techniques. In general, the output voltage and current are monitored and compared to maximum voltage and current threshold values. If a threshold is exceeded, an alarm signal is generated. The output of the over voltage and over current alarm circuitry 254 is coupled to a clipping circuit 260 and 262 and output as shown by reference numbers 274 and 276. These signals may be coupled to the main computer and/or various alarm circuitry (not shown). In general, over temperature, over current or over current alarms indicate that the system should be de-energized and serviced in order to rectify the problem The high voltage controller 32a also includes a rectangular signal generator 250. This circuitry generally signals the type high voltage generator installed in the system (e.g., 500 μA, 200 μA or 100 μA) via clipping circuit 256. This generator type output is generally shown by reference number 270. The output frequency of this output is set by a series of jumpers (not shown) and represents the type of high voltage generator based on the output frequency as shown in Table 3 below:

TABLE 3

| Generator Type Signal Frequency | Generator Type |
| --- | --- |
| 5 Hz | 500 µA |
| 2 Hz | 200 µA |
| 1 Hz | 100 µA |

Figure 4A:
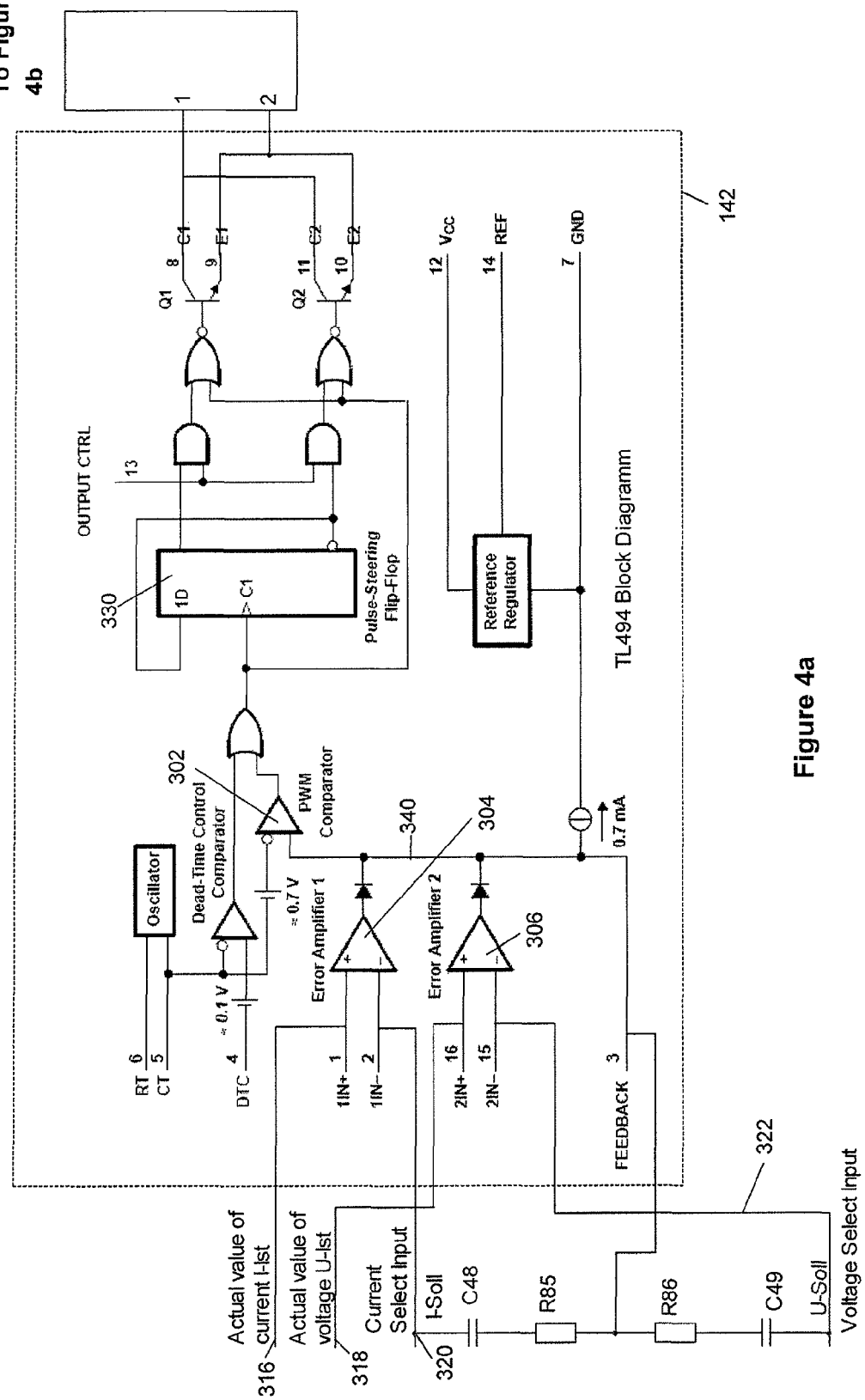
Figure 4B:
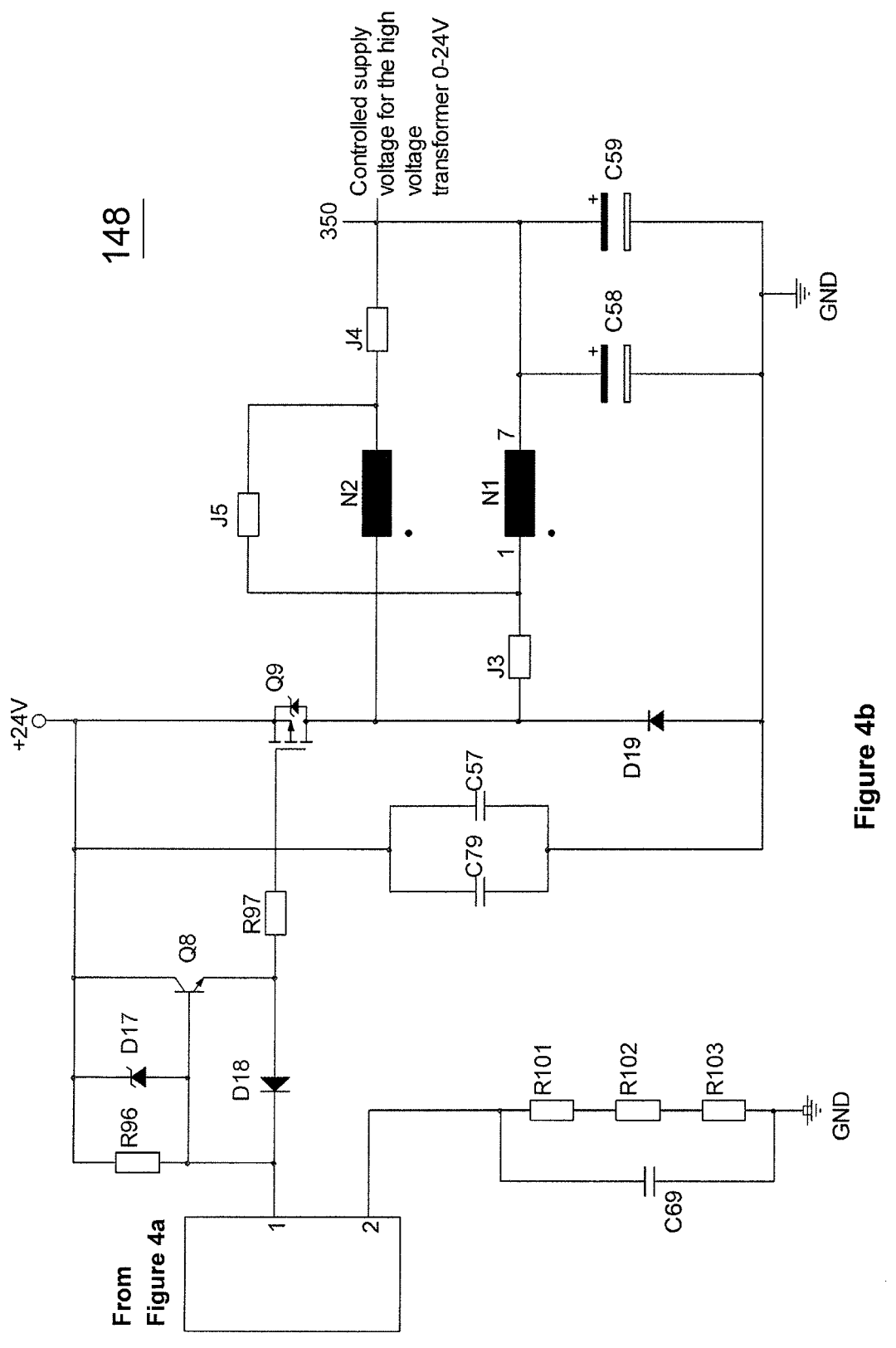

FIGS. 4a and 4b are a more detailed block diagram of the PWM controller 142 and drive circuitry 148 as discussed above. In this example, the PWM controller is implemented via a TL494 integrated circuit. Such integrated circuits are available from Texas Instruments of Dallas Tex. It is understood that a variety of PWM controllers may be utilized.

The actual value of current 316 and voltage 318 (supplied by clipping and amplifier circuits 222 and 224 shown in FIG. 3b) are coupled to the positive inputs of error amplifier 1 (304) and error amplifier 2 (306). The current and voltage select inputs 320, 322 (supplied by current to voltage converters 138 and 136 shown in FIG. 3a) are coupled to the negative inputs of error amplifier 1 (304) and error amplifier 2 (306).

One input pin of the PWM comparator 302 is connected to a RC timing network (not shown). Based on the RC time constant, a sawtooth signal with a frequency of e.g. 25 kHz is generated. The second input pin of the PWM comparator 302 is connected to the output of the error amplifier 1 (304) and error amplifier 2 (306). This control signal is the sum of output of the error amplifiers 1 and 2 and is used to drive the pulse steering flip flop 330. The output of the transistors Q1 and Q2 is enabled during the time when the sawtooth signal is greater than the control signal (generation of PWM signal). The switching signal for the basis of the two transistors is derived from two sources: the dead-time (off-time) control circuit and the error amplifier.

Figure 5A:
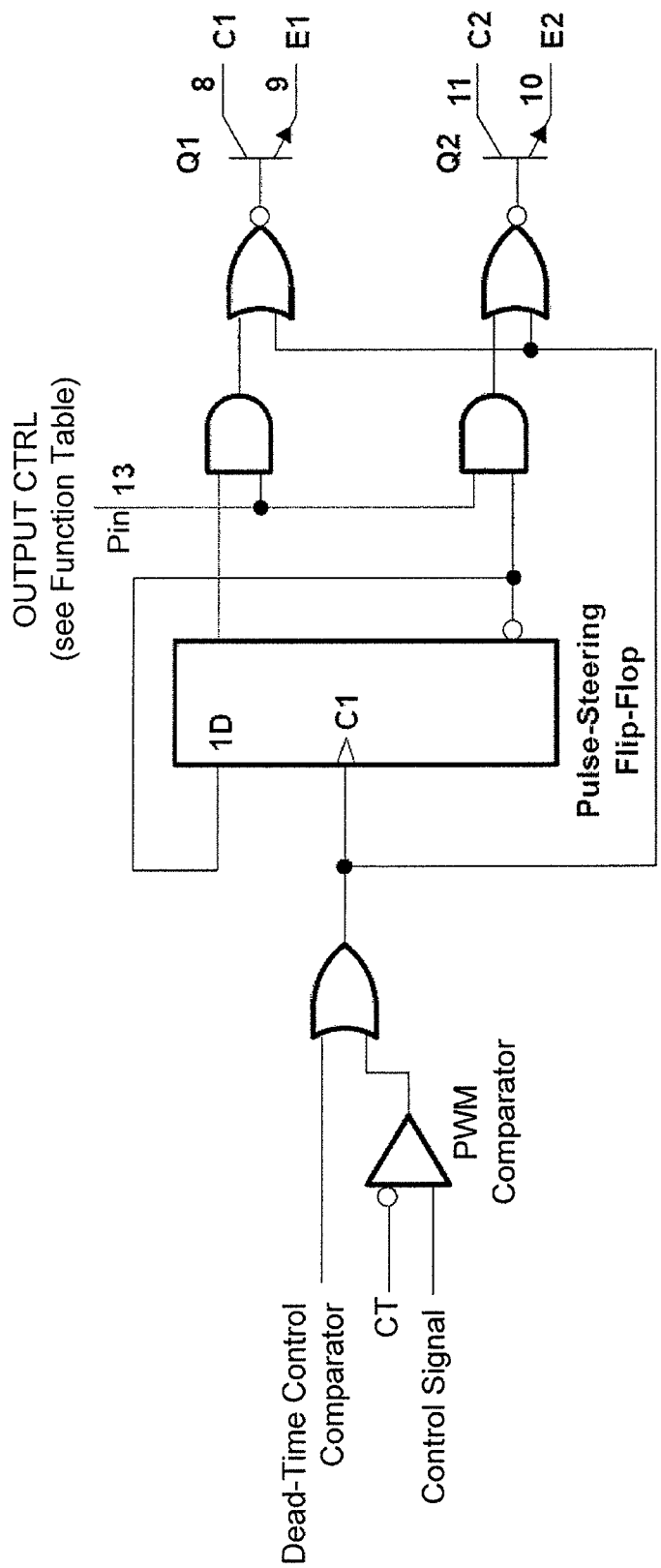
FIGS. 5a and 5b show additional detail of the output steering architecture operation of the PWM controller.
Figure 5B:
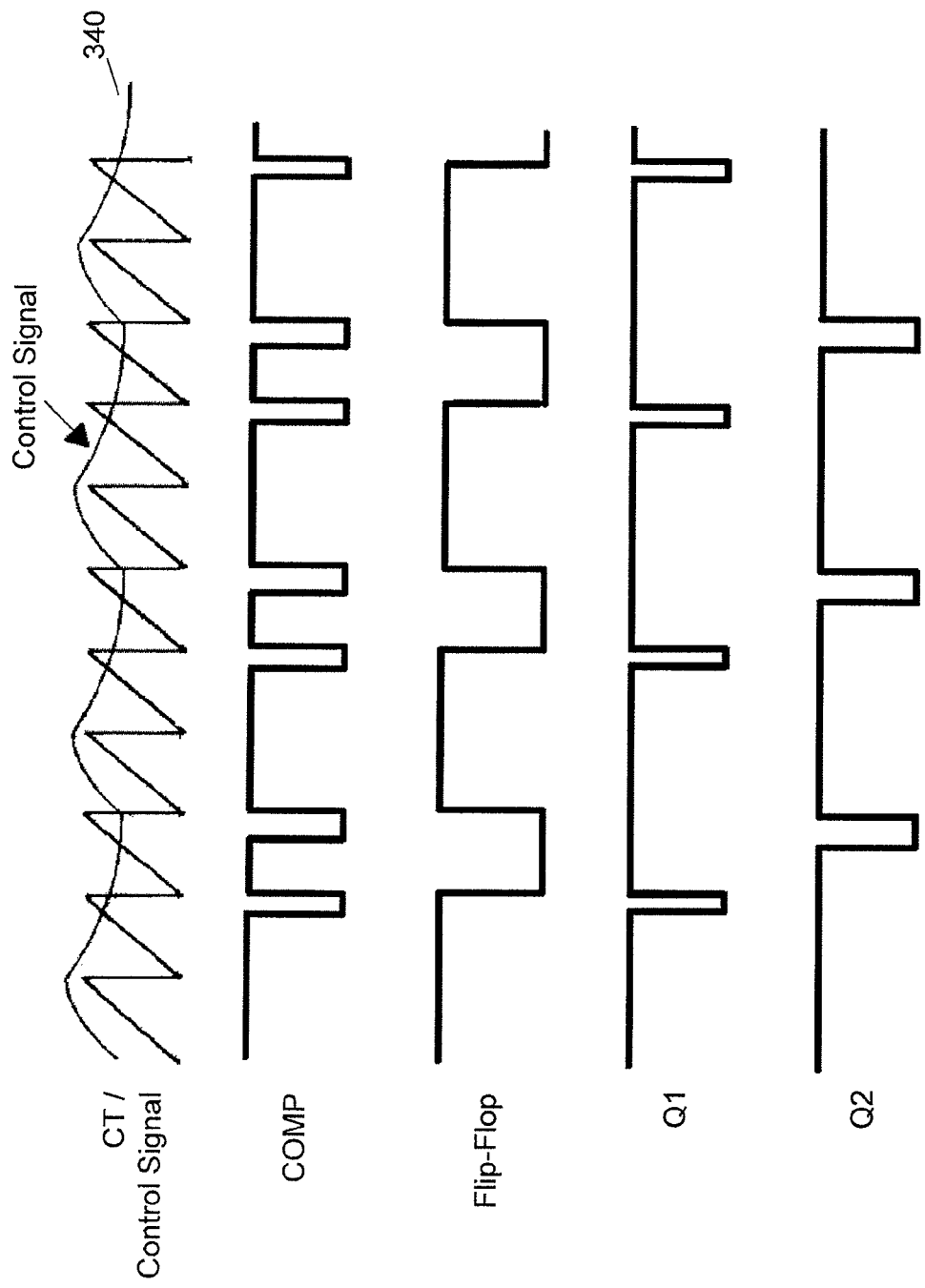

FIGS. 5a and 5b provide some additional detail on the output steering operation of the PWM controller 142. If pin 13 is connected to Vref, the PWM controller will work as a push-pull circuit. However, in this example pin 13 is connected to ground and the PWM controller 142 functions as a single ended or parallel output. In this example, Q1 and Q2 are coupled to drive circuitry 148 which outputs a DC voltage 350 that drives the center tap of the high voltage transformer 202 and ultimately generates a corresponding high voltage output 206 at the output of the cascade network 204. If the current select input 320 is below the actual current value 316, an error signal is produced by error amplifier 1 (304) and the output of Q1 and Q2 cause an increased voltage at the output 350 of the drive circuitry 148. Similarly, if the voltage select input 322 is below the actual voltage value 318, an error signal is produced by error amplifier 2 (306) and the output a Q1 and Q2 cause an increased voltage at the output 350 of the drive circuitry 148.

Figure 6:
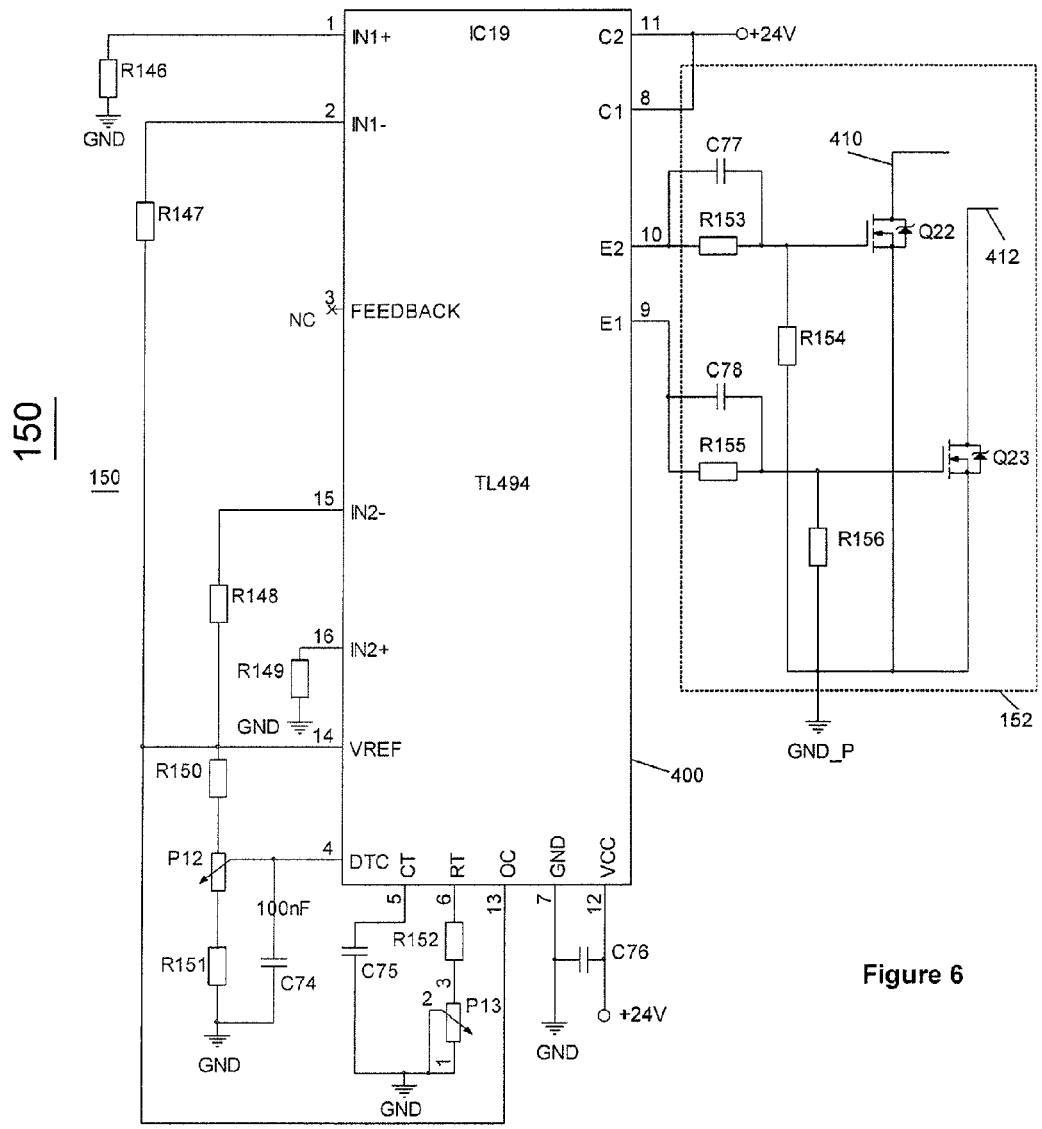
FIG. 6 is a block diagram with additional detail of the push pull control circuit an MOSFET switches for driving the high voltage transformer.

FIG. 6 is a block diagram with additional detail of the push pull control circuit 150 and the MOSFET switches 152. This circuit may also be implemented using a TL494 integrated circuit. It is understood that a variety of PWM controllers may be used. Pin 13 of the PWM controller 400 is connected to the output Vref (pin 14). This configures the PWM controller to operate as a push-pull circuit. The push pull circuit is set for an operating frequency of 25 kHz. MOSFET switches Q22 and Q23 produce symmetrical pulsed outputs 410 and 412 that drive the legs 210 and 212 of high voltage transformer 202. Because the two primary windings of the high voltage transformer are oppositely wrapped, the output of high voltage transformer is an AC voltage. The high voltage multiplier 204 is a capacitive load that is coupled to the inductance of the secondary winding of high voltage transformer 202. This forms an LC circuit with a certain resonance frequency at which the current consumption is a minimum. Each high voltage generator type may have a different resonance frequency due to differences in materials, the number of windings, number of stages of the voltage multiplier, capacitor values and the like. The push-pull control circuit 150 is fine tuned by adjusting the values of P12 (duty cycle) and P13 (frequency) for minimum current.

In the embodiment disclosed above, the high voltage controller 32a uses a first PWM controller to provide automatic closed loop control and generate a DC output between 0 and 24 volts. This signal is used to drive the center tap of the high voltage transformer 202. A second PWM controller is used for push pull control to drive the legs 210, 212 of the high voltage transformer 42a with a fixed signal (in this example, symmetrical pulsed signals between 0 and 24 volts). This configuration allows for very accurate and compact circuitry for controlling a high voltage transformer. This results in a configuration that may be readily incorporated into a package is suitable for mounting within a typical electrostatic spray gun. For example, the circuitry disclosed above may be implemented into a package having the following dimensions 70 mm×70 mm×135 mm (width×high×depth). The above configuration also provides a unique combination of functions that provide improved control of a high voltage generator.

FIG. 7 is a block diagram with additional structure for operating the PWM controller in diagnostic mode. In diagnostic mode, the selected values and the actual values for voltage and current are replaced with diagnostic values. The diagnostic values may be implemented using a variety of techniques including voltage dividers. In this example, the voltage select input 126 and a diagnostic voltage value 506 are coupled to the input of switch 502. Similarly, current select input 128 and diagnostic current value 508 are coupled to the input of switch 504. The output of switches 502 and 504 are coupled to the PWM controller 142. If diagnostic mode is selected, diagnostic voltage value 506 and diagnostic current value 508 are selected by switches 502 and 504.

Similarly, the actual values for current 216 and voltage 218 and 220 are replaced with diagnostic values 516, 518 and 520 via switches 510, 512 and 514. The PWM controller 142 will increase the duty cycle until the output of the high voltage generator reaches the diagnostic values. The diagnostic voltage value 506 corresponds to a predetermined voltage at the center tap 214 of the high voltage transformer 202. Other diagnostic test includes testing the shutdown of the high voltage system by increasing the selected values over the threshold values for over voltage and over current. Under these conditions, the main computer may increases the current select input 128 and voltage select input 126 and monitor the over current and over voltage alarm signals 274, 276 to determine whether the alarm signals are generated at the preselected alarm thresholds. Yet another diagnostic test includes testing the function of all analogue circuits and the fixed threshold values. The main computer may compare the current select input 126 and voltage select input 128 with the actual values of load current 242 and output voltage 240. If these values deviate by more than a preselected threshold (e.g., ±5%), there is failure in the circuit. If no error message is generated by the main computer during the diagnostic mode the high voltage system may go to normal mode.

FIG. 8 is an embodiment of safe shutdown circuitry 146. In conventional systems, de-energizing circuitry is accomplished by cutting power at the power supply. This may lead to delays in the actual power down of attached circuitry due to capacitance present in the output portion of the power supply. Accumulated charge slowly bleeds off and several seconds may elapse before the circuitry is actually de-energized. Such delay is undesirable when de-energizing a high voltage system. Safe shutdown circuitry 146 provides direct power supply control at the power supply pin (e.g., Vcc) of PWM controller 142. This allows PWM controller 142 to be de-energized immediately upon receipt of a power off signal. This in turn de-energizes the output of PWM controller 142 and the control signal to the high voltage transformer 202. On/Off input 120 is routed to R106 via clipping circuit 130. When On/Off input 120 is in the on state, Q10 and Q11 are conducting and the Vcc pin 143 receives power. When On/Off input 120 transitions to the off state, Q10 and Q11 stop conducting and the Vcc pin 143 is immediately de-energized. This minimizes the time delay associated with a power down signal.

Figure 9:
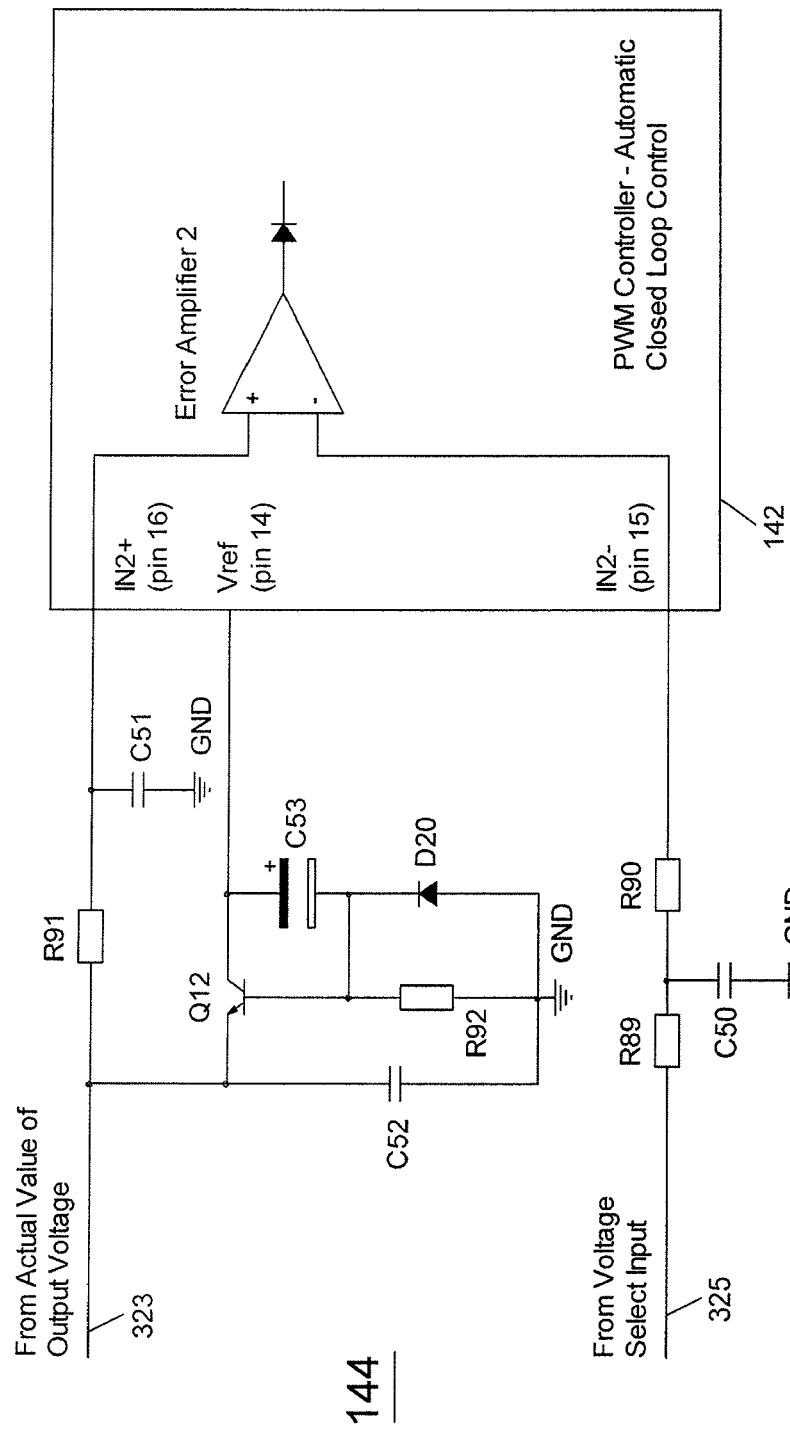
FIG. 9 is an embodiment of soft start control circuitry.

FIG. 9 is an embodiment of soft start control circuitry 144. The voltage multiplier is a capacitive load and the typical load at the output 206 of high voltage generator 204 is also capacitive in nature. The following example illustrates operation of the high voltage controller without soft start control circuitry 144. Assume for this example the high voltage controller is switched on and the voltage select input is set to 4 mA (output voltage is 0V). Assume the voltage select input is suddenly set to 10 mA for an output voltage of 100 kV. At this time, the actual output voltage is 0V and the input to error amplifier2 (IN2+, pin 16) is 0V. However, the voltage input to the IN2− input will suddenly increase. This will cause a very large difference at the input of error amplifier2. The PWM controller 142 will rapidly increase the duty cycle and switch Q9 will remain in the on state for an extended period (See FIGS. 4a and 4b). This causes a rapid increases in voltage at the output of the high voltage generator. Due to the capacitance present at the output of the high voltage generator, this rapid change in output voltage and will result in a very large inrush current.

In order to minimize such inrush currents, the output signal of error amplifier2 is ramped up slowly through the use of soft start control circuitry 144. This causes the output voltage of the high voltage generator to ramp up slowly. An RC time constant τ is set by C53 and R92. Assume for example a large voltage select signal is placed at terminal 325. As the high voltage output voltage increases the actual value of the output voltage at terminal 323 rises. Transistor Q12 will switch on and will remain on for a period of time defined by the time constant τ. During this time, the PWM controller 142 will not immediately increase the duty cycle. Once capacitor C53 is charged 100%, Q12 will be switched off and the voltage at IN2+ will be the actual value at terminal 323.

Figure 10:
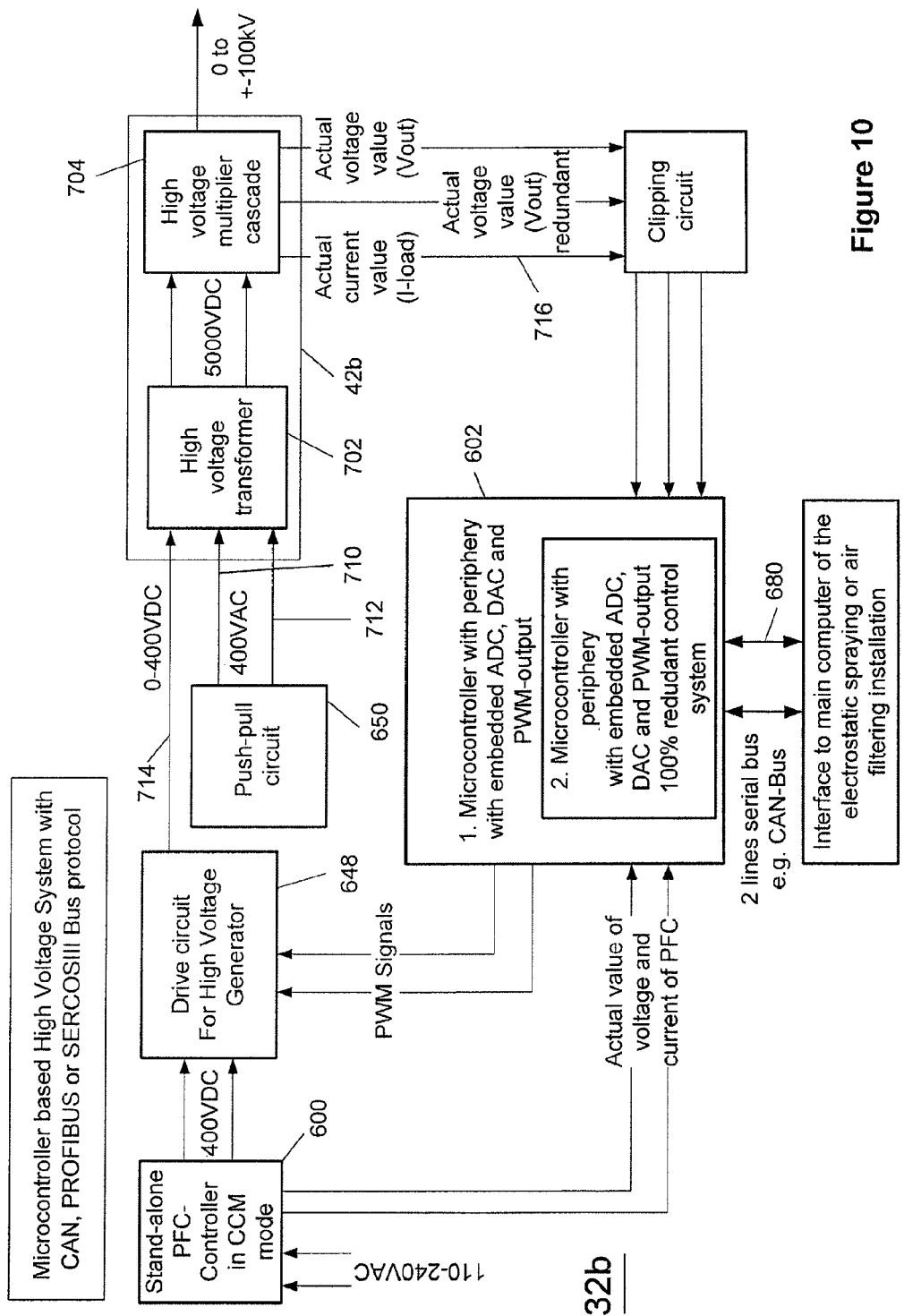
FIG. 10 is a block diagram of a microcontroller based high voltage controller.

In the foregoing examples, the high voltage controller 32a is implemented with analog circuitry. In another embodiment, the high voltage controller 32b is implemented with a digital processor. FIG. 10 is a block diagram of a microcontroller based high voltage controller.

In this embodiment, the high voltage controller 32b is supplied with power via a 110-240 VAC supply via a Power Factor Correction (PFC) controller 600. Suitable PFC controllers are available from a variety of sources including Fairchild Semiconductor of Portland Me., Infineon technologies AG of Munich, Germany and various other manufacturers. The high voltage controller 32b is implemented with redundant microcontrollers shown by block 602. Suitable microcontrollers may include on or more embedded analog to digital converters (ADC), one or more embedded digital to analog converters (DAC) and a PWM output. Such microcontrollers are available from a variety of sources including Intel Corporation of Santa Clara, Calif., PIC Microcontroller, Microchip or Atmel Microcontroller. It is also understood that suitable microcontrollers typically include program memory such as Electrically Erasable Programmable Read Only Memory (EEPROM) and Random Access Memory (RAM).

The high voltage controller 32b also includes a push-pull control circuitry as shown at block 650. This circuitry is used to drive the high voltage generator 42b via high voltage transformer 702. In this example, the input of high voltage transformer 702 has two outer legs 710, 712 connected to windings as discussed above in connection with the analog embodiment. The input of high voltage transformer 702 also has a center tap 714. Push pull control circuitry 650 drives the outer legs of the of high voltage transformer 710, 712 via MOSFET switches as discussed above in connection with the analog embodiment. The output of the PWM controller is implemented in microcontroller 602. PWM output signals 647 are coupled to drive circuitry shown generally by block 648. The PWM output ultimately drives the high voltage transformer via center tap 714. Actual control of the high voltage output is accomplished by varying the PWM output of microcontroller 602 and the drive signal at the center tap 714 of the high voltage transformer 702 as discussed above in connection with FIGS. 4a and 4b.

Bidirectional communications between the high voltage controller 32b and the main computer of the spraying or air filtering installation is implemented with the use of a high speed serial bus 680. A variety of serial protocols may be used such as Controller Area Network (CAN), PROFIBUS or SERCOSIII. It is understood that a wide variety of network and communications techniques and protocols may be used.

In the previous embodiment, the high voltage controller uses a 110-240 VAC power supply and is generally operated at a higher working voltage (e.g., 400V as opposed to 24V). This allows the high voltage controller to generate higher load currents. The previous embodiment also includes a microcontroller to generate the PWM signals for driving the high voltage transformer. The microcontroller provides automatic closed loop control and generate a DC output (in this case between 0 and 400V). This signal is used to drive the center tap of the high voltage transformer 702. A second PWM controller is used for push pull control to drive the legs 710, 712 of the high voltage transformer 42b with a fixed signal (in this example, symmetrical pulsed signals between 0 and 400V). This configuration functions similar to first embodiment disclosed above and allows for very accurate and compact circuitry for controlling a high transformer. This results in a configuration that may be readily incorporated into a package is suitable for mounting within a typical electrostatic spray gun.

Figure 11:
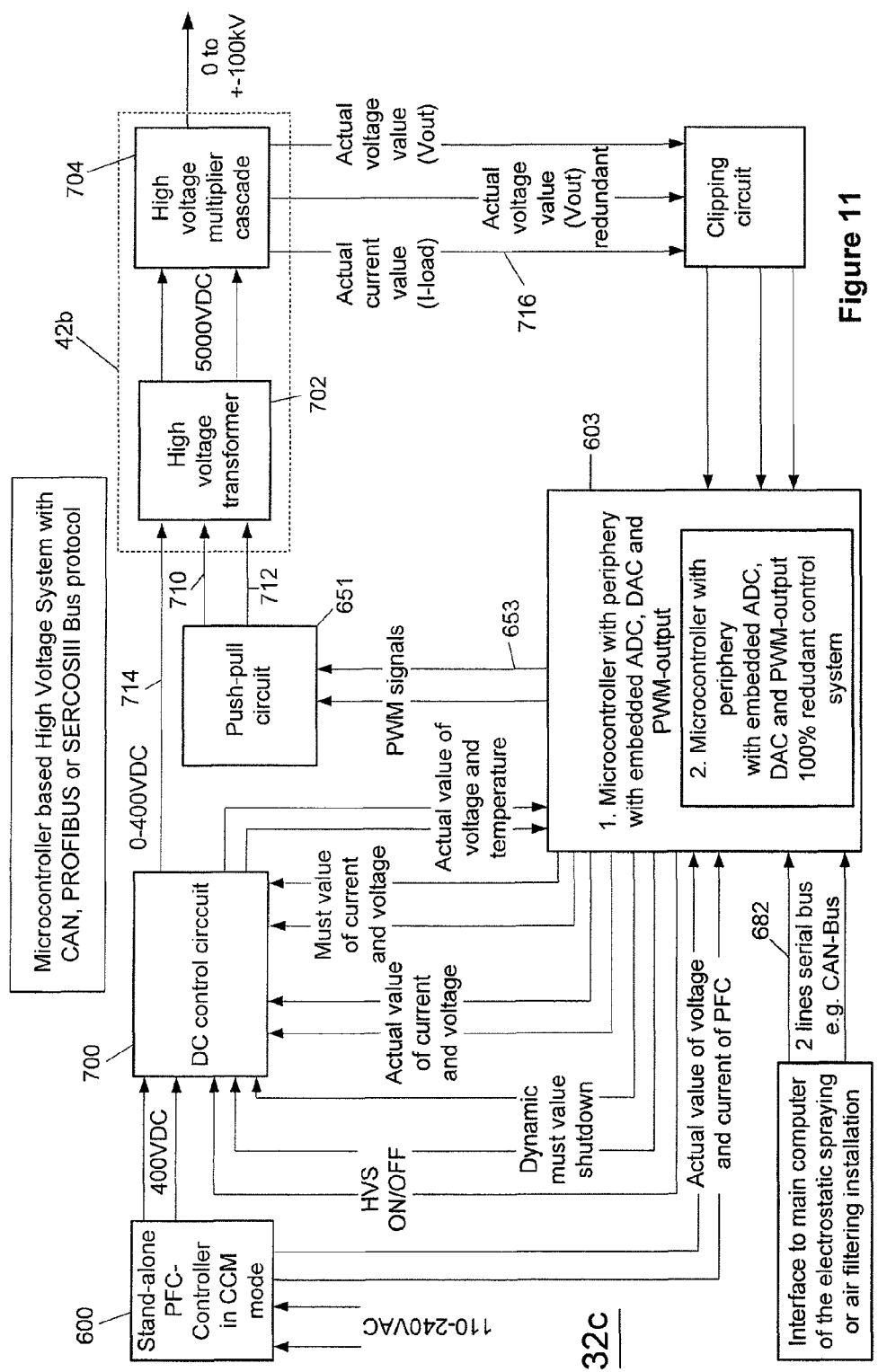
FIG. 11 is an embodiment of a microcontroller based high voltage controller with resonant frequency control.

FIG. 11 is a microcontroller based embodiment of a high voltage controller with resonant frequency control. In this embodiment, the high voltage controller 32c is supplied with power via a 110-240 VAC supply via a Power Factor Correction (PFC) controller 600 as discussed above. The high voltage controller 32c is implemented with redundant microcontrollers shown by block 603. Suitable microcontrollers may include on or more embedded analog to digital converters (ADC), one or more embedded digital to analog converters (DAC) and a PWM output as discussed above.

The high voltage controller 32c also includes a push-pull control circuitry as shown at block 651. This circuitry is used to drive the high voltage generator 42b via high voltage transformer 702. In this embodiment, the input of high voltage transformer 702 has two outer legs 710, 712 connected to windings as discussed above in connection with the analog embodiment. The input of high voltage transformer 702 also has a center tap 714. Push pull control circuitry 650 drives the outer legs of the of high voltage transformer 710, 712 via MOSFET switches as discussed above in connection with the analog embodiment.

Microcontroller 653 generates PWM signals 653 to control the duty cycle and frequency of the push-pull circuit 651. As discussed above, the high voltage multiplier 704 is a capacitive load that is coupled to the inductance of the secondary winding of high voltage transformer 702. This forms an LC circuit with a certain resonance frequency at which the current consumption is a minimum. Each high voltage generator type may have a different resonance frequency due to differences in materials, the number of windings, number of stages of the voltage multiplier, capacitor values and the like. The push-pull control circuit 651 is fine tuned for duty cycle and frequency by adjusting PWM output based the actual load current 716.

Figure 12:
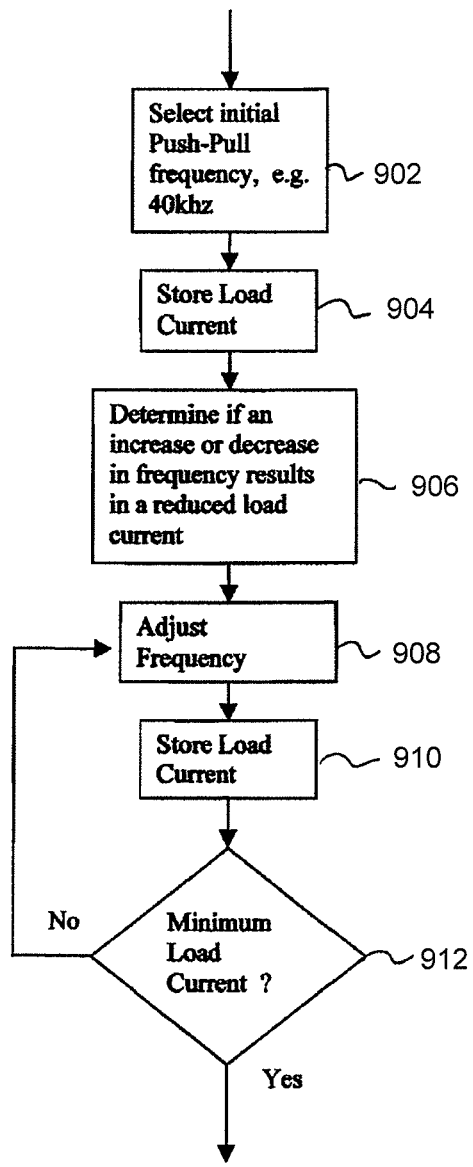
FIG. 12 is a basic flow diagram for automatic control of the push-pull output circuit output frequency.

FIG. 12 is a basic flow diagram for automatic control of the push-pull output circuit 702 output frequency. It is understood that the flowcharts disclosed herein show only rudimentary representations of basic processing functions. Additional entry points and exit points may be added. Additional pre processing and initialization may be implemented. It is also understood that additional post processing and diagnostics may also be implemented.

An initial push-pull frequency is selected, for example 40 kHz as shown by block 902. A snapshot of the actual value of the load current is at least temporarily stored in memory as shown by block 904. The microcontroller will then determine whether an increase or decrease in push-pull output frequency results in a reduction of load current as shown by block 906. This may be accomplished by lowering the output frequency and comparing a snapshot of the actual value of the load current to the value obtained at block 904. If the load current does not decrease, the process may then be repeated with an increased output frequency. A snapshot of the actual value of the load current is compared to the value obtained at block 904. Once the desired direction is obtained the output frequency is adjusted by a suitable increment (e.g., 1 kHz) as shown by block 908. Another snapshot of the load current is taken as shown by block 910. The load current value obtained at block 910 is compared to the previous load current value. If load current value decreases, control is passed to block 908 and the process is repeated as shown by block 912. Once a minimum is detected (i.e., the load current begins to increase), the process is complete and the output frequency is set to yield the lowest load current. It is understood that this process may be carried with several frequency adjustment step sizes (e.g., 5 kHz, 2 kHz, 1 kHz, 500 Hz . . . ) to more efficiently zero in on the optimal output frequency. It is also understood that this process may be repeated as needed.

Figure 13:
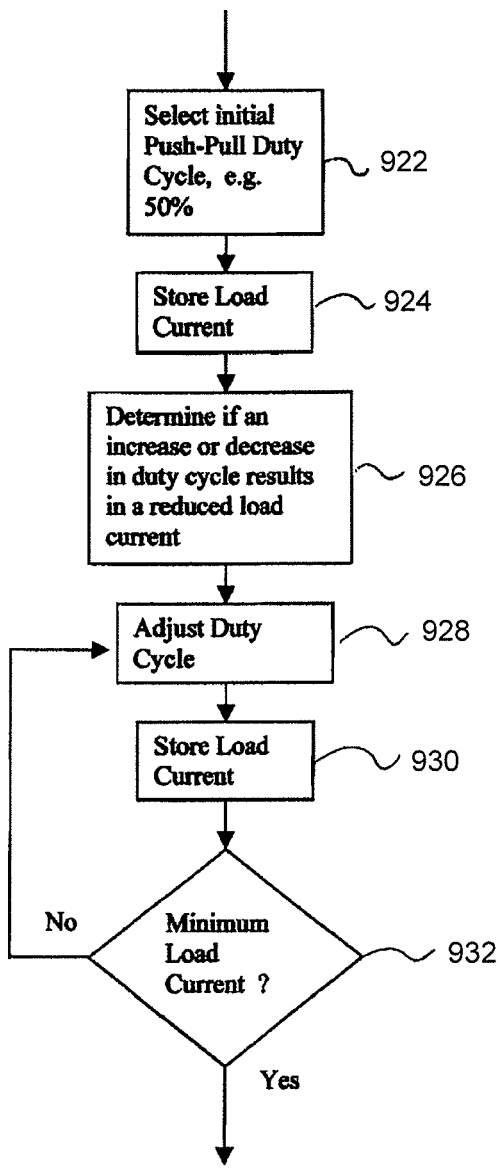
FIG. 13 is a basic flow diagram for automatic control of the push-pull output circuit duty cycle based on actual load current.

FIG. 13 is a basic flow diagram with a similar technique for establishing the optimal push-pull duty cycle based on actual load current. An initial push-pull output duty cycle is selected, for example 50% as shown by block 922. A snapshot of the actual value of the load current is at least temporarily stored in memory as shown by block 924. The microcontroller will then determine whether an increase or decrease in push-pull duty cycle results in a reduction of load current as shown by block 926. This may be accomplished by lowering the duty cycle and comparing a snapshot of the actual value of the load current to the value obtained at block 924. If the load current does not decrease, the process may then be repeated with an increased duty cycle. A snapshot of the actual value of the load current is compared to the value obtained at block 924. Once the desired direction is obtained the duty cycle is adjusted by a suitable increment (e.g., 1%) as shown by block 928. Another snapshot of the load current is taken as shown by block 930. The load current value obtained at block 930 is compared to the previous load current value. If the load current value decreases, control is passed to block 928 and the process is repeated as shown by block 932. Once a minimum is detected (i.e., the load current begins to increase), the process is complete and the duty cycle is set to yield the lowest load current. It is understood that this process may be carried out with several duty cycle adjustment step sizes (e.g., 5%, 2%, 1%, 0.5% . . . ) to more efficiently zero in on the optimal output duty cycle. It is also understood that this process may be repeated as needed.

15a and 15b are a block diagram with additional detail of push-pull circuitry. OR gate 960 has 4 inputs. The first input comes from a first schmitt trigger 962 (threshold detector) which works at a voltage of 4.9V. The second input comes from a second schmitt trigger 964 (low voltage detect). The other 2 inputs come from the PWM comparator 966 and the deadtime comparator 968. The output of OR gate 960 will be at high level if one of these four inputs is high. In a normal situation, both inputs from the schmitt triggers 962, 964 are at low level. The OR gate output is then only dependent on the output level of PWM comparator 966 and the deadtime comparator 968. Pin 13 is connected to Vref=5V (See timing diagram). In this case a change of the oscillator 972 frequency or the deadtime will influence the duty cycle and frequency of the clock input CK of the flip-flop 970 and therefore the push-pull duty cycle and frequency as shown in timing diagram. The outputs Q and /Q of the flip-flop are logically AND linked with the input pin 13. These signals are NOR linked with the output signal of the OR gate to control the Q1 and Q2 (see timing diagram).

It is understood that such circuitry can be realized in software in microcontroller based embodiments. For example, the oscillator frequency can be set by using a 16 bit timer. The deadtime can be set with use of a variable e.g. unsign dead_time=5 (e.g. deadtime is set to 50% for the initial loop). The PWM and deadtime comparators can also be realized in software. As discussed above, the functionality of error amplifier-1 (974) and error amplifier-2 (976) are realized in software. This allows microcontroller based embodiments to generate variable frequency and duty cycle signals with minimal hardware.

Returning to FIG. 11, the high voltage controller 32c uses DC control circuit 700 to provide automatic closed loop control and generate a DC output (in this case between 0 and 400V). Implementation of this circuitry may be accomplished using a PWM controller as discussed above in connection with the first embodiment. It is understood that a variety of configurations are possible based on the disclosure contained herein. For example, the function of the DC control circuit 700 may also be implemented via PWM controller embedded within processor 603.

Figure 14:
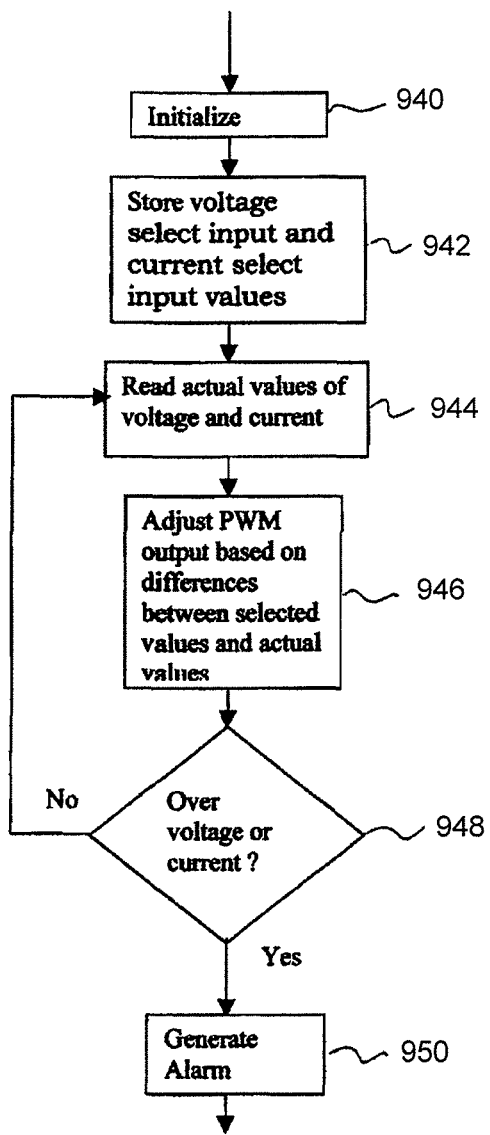
FIG. 14 is a basic flow diagram of microcontroller based closed loop control.
Figure 15A:
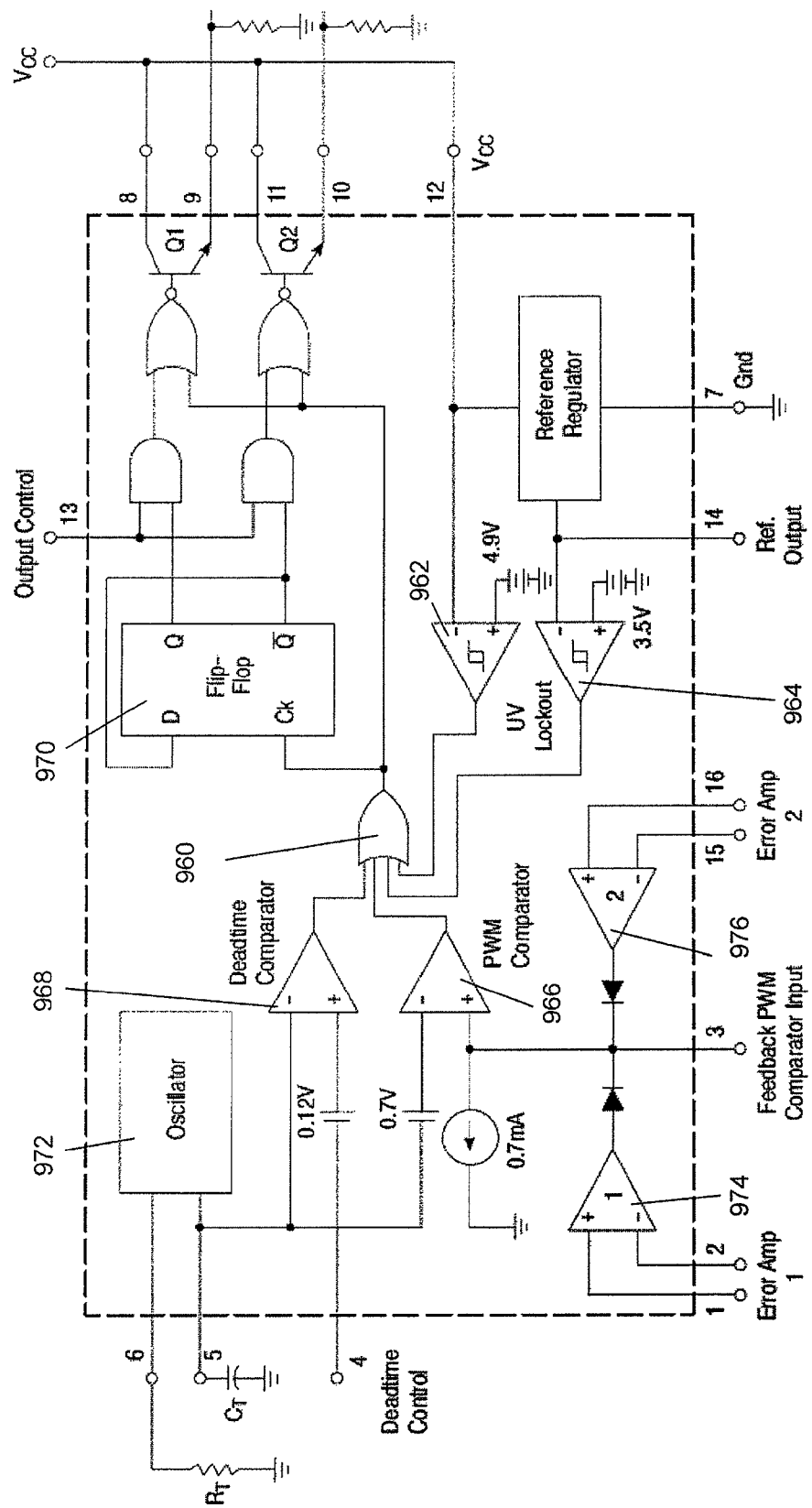
FIGS. 15a and 15b are a block diagram with additional detail of push-pull circuitry.
Figure 15B:
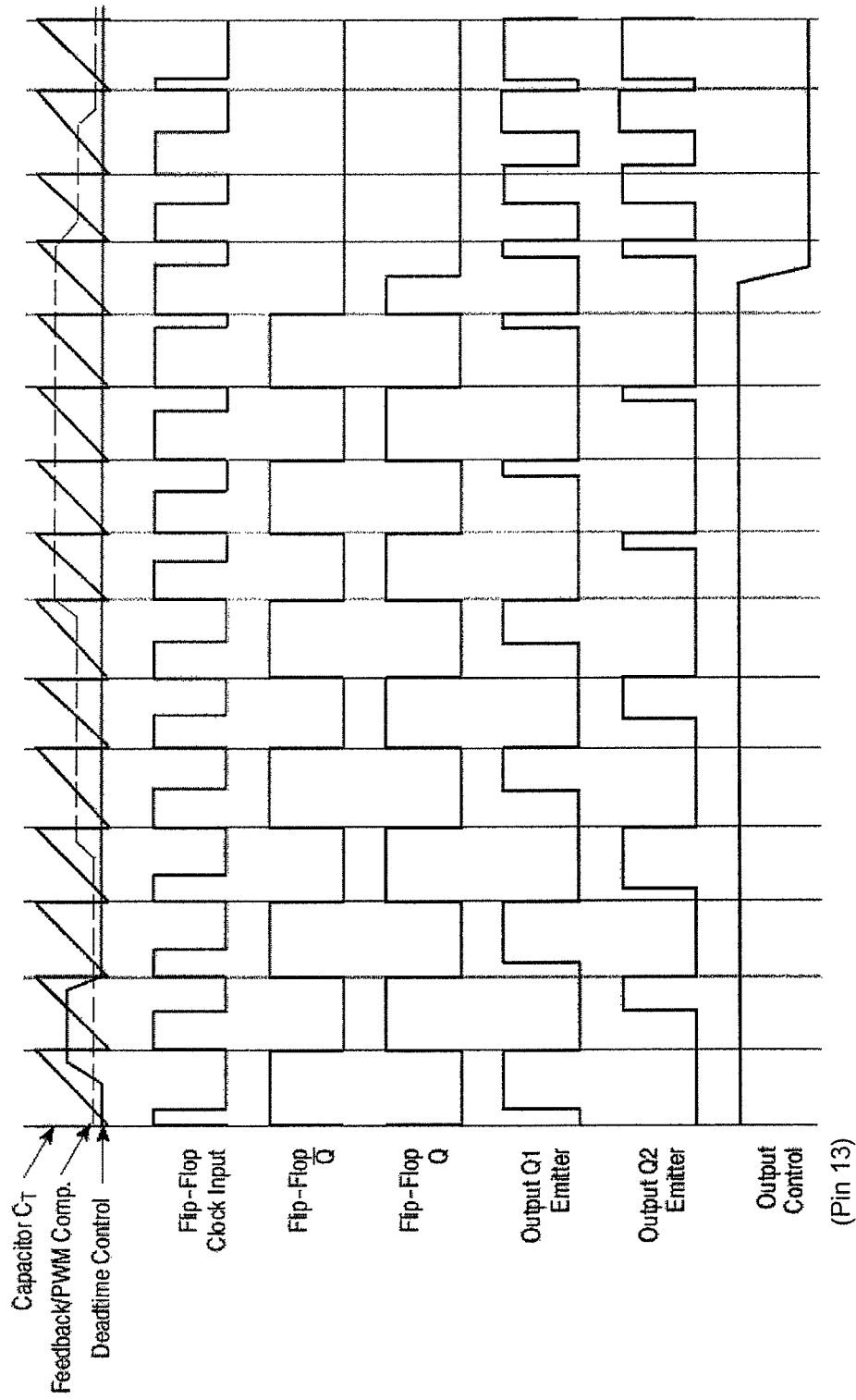

FIG. 14 is a basic flow diagram of microcontroller based closed loop control. This flow chart is generally applicable to the embodiment shown in FIG. 10. The microcontroller memory is initialized as show by block 940. The voltage and current select inputs are stored in memory as shown by block 942. It is understood that these values are typically supplied and periodically updated by a main computer. The actual values for voltage and load current at the output of the high voltage generator are read. It is understood that these values may be read via an A/D converter embedded within the microcontroller. The voltage select input is compared to the actual voltage. If the actual voltage is above or below voltage select input by a preselected threshold, the PWM output is adjusted accordingly. Similarly, the current select input is compared to the actual current. If the actual current is above or below current select input by a preselected threshold, the PWM output is adjusted accordingly. See block 946. The actual voltage and current are also compared to maximum values. If the actual voltage and/or current exceed the maximum values, an alarm signal is generated as shown by block 950.

The microcontroller based embodiments disclosed above may implement several functions that are not present in the analog embodiment. For example, the microcontroller may limit the slope of the output voltage and/or load current. The microcontroller receives and stores digital representations of the voltage and/or current select inputs via the serial bus. The microcontroller also receives and stores digital representations of the actual values of output voltage and load current. These values are ultimately used by the microcontroller to drive the high voltage generator as described in FIG. 14. The microcontroller also contains embedded timing capabilities. Thus, the microcontroller may control the rate at which the voltage (i.e., PWM duty cycle) is increased or decreased. The microcontroller may store a maximum slope for output voltage and/or load current increase or decrease. By monitoring the actual values of output voltage and load current over a known time period, the microcontroller may temporarily adjust the values provided to the drive circuitry (i.e., temporarily override the voltage select and/or current select inputs) so as to not exceed the maximum slope for output voltage and/or load current increase or decrease. This functionality may also be used to implement soft start control.

As discussed above in connection with the analog embodiment, microcontroller based embodiment the microprocessor based embodiments may also include a voltage controlled mode, current controller mode and a combined voltage and current controller mode. For voltage controlled mode, the voltage select input is set to 0. The current select input is set to the desired load current. Assume for example a 100 μA high voltage generator is used and the current select input 50 μA. The high voltage controller will vary the high voltage generator output voltage such that a 50 μA load current is maintained.

For current controlled mode, the current select input is set to 0. The voltage select input is set to the desired output voltage. Assume for example the voltage select input is set to 80 kV. The high voltage controller will vary the high voltage generator output voltage such that 80 kV is maintained at the load. For voltage and current controlled mode, the voltage select input and the current select input 128 are set to the desired values. The high voltage controller will vary the high voltage generator output voltage such the selected voltage and current set points are maintained at the load. Assume for example the voltage and current select inputs are set to 70 kV and 40 μA. Depending on the conditions at the load, the high voltage generator will achieve either the selected voltage or the selected current.

Figure 7:
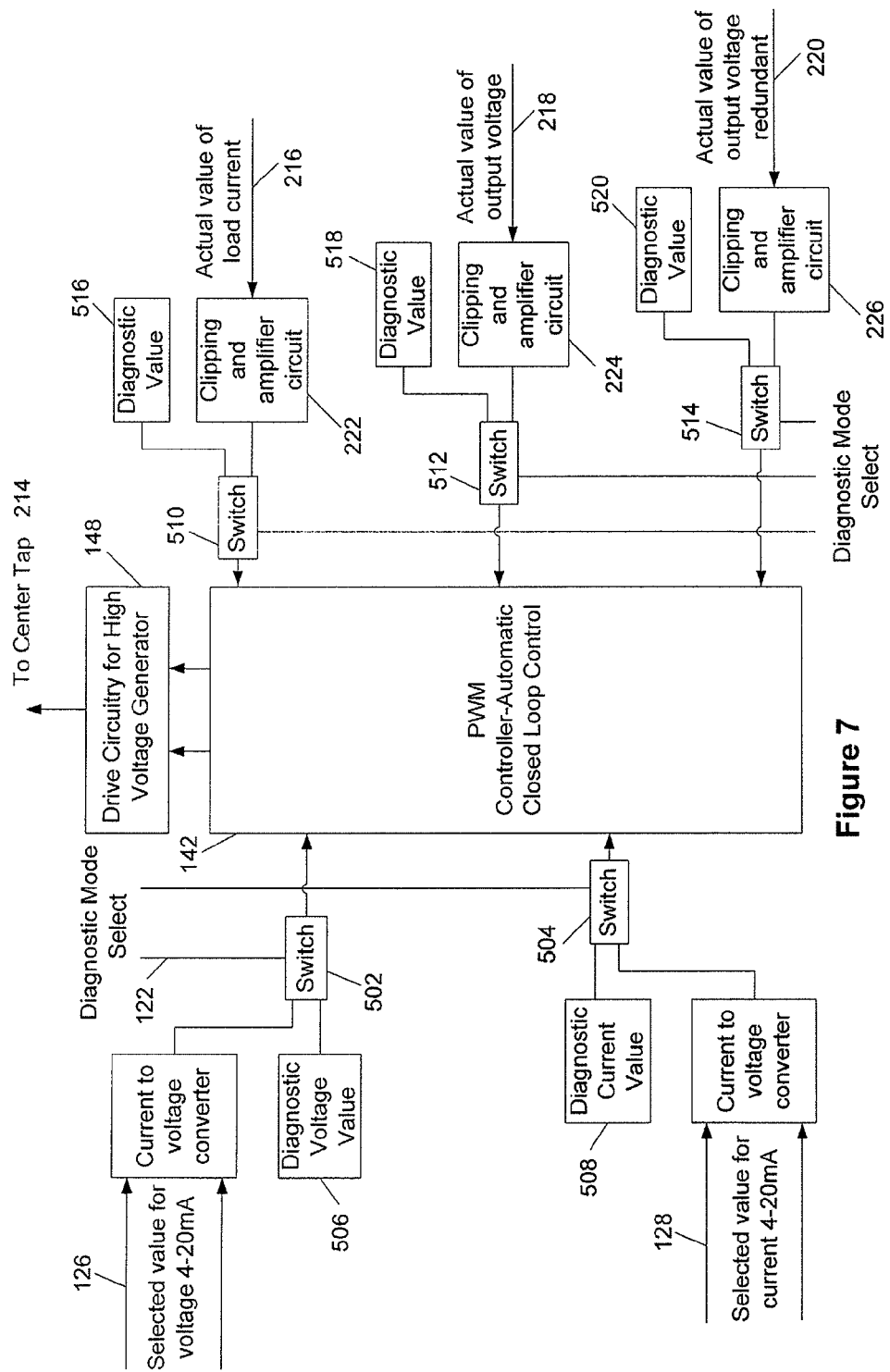
FIG. 7 is a block diagram with additional structure for operating the PWM controller in diagnostic mode.
Figure 8:
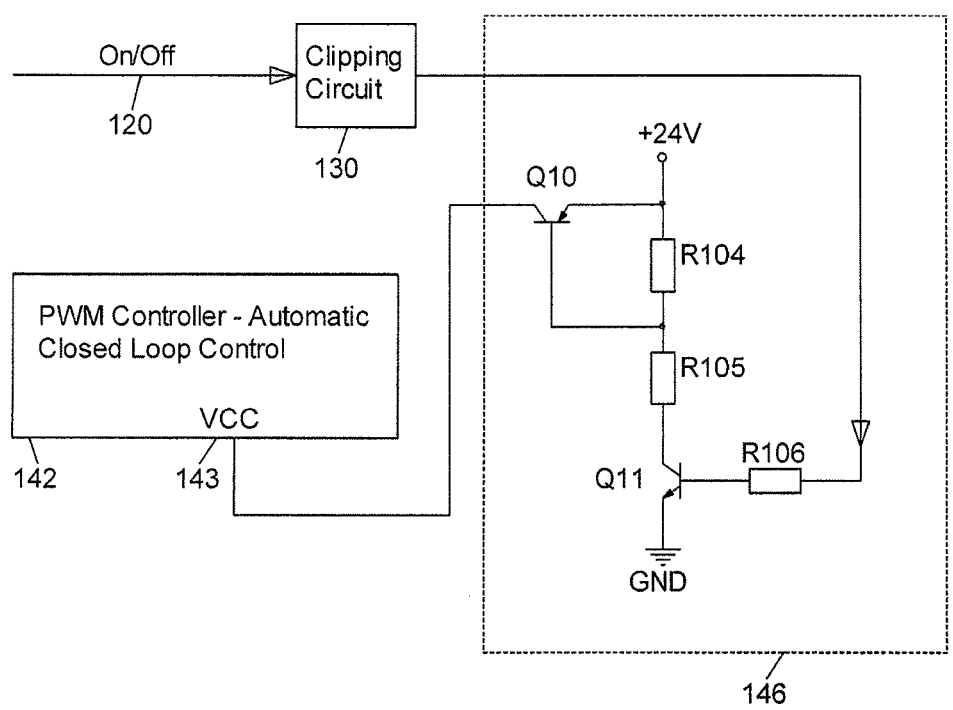
FIG. 8 is an embodiment of safe shutdown circuitry.

The microcontroller may also implement advanced diagnostic functions. In the analog embodiments, diagnostic mode is initiated via diagnostic mode select 122. See FIGS. 3 and 7. When diagnostic mode is selected, a plurality of switches are activated and simulated values are substituted for the voltage and current select inputs as well as the actual values. This allows the main computer to check the operation of the input and output circuitry. The main computer may also perform diagnostics with the high voltage controller operating in normal mode. For example the main computer may systematically change the voltage and current select inputs and compare the expected output values for voltage and current to the actual values. In the microcontroller based embodiments, the microcontroller may perform these functions directly and report the results to the main computer via a status message or the like.

Although features and elements are described above in particular combinations, each feature or element may be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

What is claimed is:

1. A high voltage controller comprising:
   a voltage select input for setting a desired output voltage and a current select input for setting a desired load current,
   an actual voltage input for receiving a high voltage output feedback signal and an actual current input for receiving a load current feedback signal,
   first circuitry configured to generate an alternating current (AC) drive signal, second circuitry configured to generate a direct current (DC) drive signal, and closed loop control circuitry configured to adjust the DC drive signal;
   wherein the high voltage controller is configured to operate in:
      a current controlled mode wherein the closed loop control circuitry is configured to adjust the DC drive signal based on the desired output voltage set at the voltage select input and based on the feedback signals received by at least one of the actual voltage and actual current inputs,
      a voltage controlled mode wherein the closed loop control circuitry is configured to adjust the DC drive signal based on the desired load current set at the current select input and based on the feedback signals received by at least one of the actual voltage and actual current inputs, and,
      a combined voltage and current controlled mode wherein the closed loop control circuitry is configured to adjust the DC drive signal to achieve the desired output voltage and the desired load current set by at least one of the voltage select and current select inputs and based on the feedback signals received by at least one of the actual voltage and actual current inputs;
   wherein the DC drive signal is adjusted based on a predetermined linear relationship between at least one of the desired output voltage and the desired load current and a current value of at least one of the voltage select input and the current select input.

2. The high voltage controller of claim 1 wherein the first circuitry comprises a push-pull circuit.

3. The high voltage controller of claim 1 wherein the second circuitry comprises a pulse width modulation (PWM) controller.

4. The high voltage controller of claim 3 further comprising:
 soft start circuitry coupled to at least one input of the PWM controller.

5. The high voltage controller of claim 3 further comprising:
 an on/off input and safe shutdown circuitry coupled to the on/off input, the safe shutdown circuitry being configured to de-energize at least one power supply pin of the PWM controller based on the on/off input.

6. The high voltage controller of claim 1 further comprising:
 a diagnostic mode select input and a plurality of switches, each switch being configured to select a predetermined diagnostic input signal based on the diagnostic mode select input; and
 wherein at least one of the voltage select input, the current select input, the actual voltage input, and the actual current input is replaced with the predetermined diagnostic input signal when operating in a diagnostic mode.

7. The high voltage controller of claim 1 further comprising:
 at least one temperature sensor coupled to over temperature alarm circuitry.

8. The high voltage controller of claim 1 further comprising:
 over voltage and over current alarm circuitry.

9. The high voltage controller of claim 1 further comprising:
 a high voltage generator coupled to the AC and DC drive signals.

10. The high voltage controller of claim 9 wherein the high voltage generator comprises:
 a high voltage transformer having a pair of primary windings having a center tap, the AC drive signal being coupled to the primary windings and the DC drive signal being coupled to the center tap.

11. The high voltage controller of claim 10 further comprising:
 a rectangular signal generator configured to generate an output signal having an output frequency that is mapped to a maximum current capability of the high voltage generator.

12. The high voltage controller of claim 1 further comprising:
 a microcontroller configured to generate the DC drive signal.

13. The high voltage controller of claim 1 further comprising:
 a microcontroller configured to provide closed loop control and adjust the DC drive signal based on at least one of the voltage select and current select inputs and at least one of the actual voltage and actual current inputs.

14. The high voltage controller of claim 2 further comprising:
 a microcontroller configured to adjust at least one of an output frequency and a duty cycle of the push-pull circuit based on the actual current input.

15. The high voltage controller of claim 14 further comprising:
 at least one serial interface configured to connect with an external computer.

16. The high voltage controller of claim 15 wherein the serial interface is configured to operate under at least one of a Controller Area Network (CAN), PROFIBUS or SERCOSIII protocol.

17. The high voltage controller of claim 1 further comprising:
 a microcontroller configured to limit a slope of the DC drive signal based on a predefined threshold and the actual voltage input.

18. The high voltage controller of claim 1 further comprising:
 a microcontroller configured to limit a slope of the DC drive signal based on a predefined threshold and the actual current input.

19. The high voltage controller of claim 1 wherein the voltage select input, current select input, actual voltage input and actual current input are digital inputs.

20. The high voltage controller of claim 19 comprising:
 a microcontroller configured to provide at least one of the voltage controlled mode, the current controller mode or the combined voltage and current controller mode.

21. A method of providing high voltage control of a high voltage generator, the method comprising:
 providing a voltage select input for setting a desired output voltage and a current select input for setting a desired load current,
 providing an actual voltage input for receiving a high voltage output feedback signal and an actual current input for receiving a load current feedback signal,
 generating an alternating current (AC) drive signal,
 generating a direct current (DC) drive signal, and
 providing closed loop control for adjusting the DC drive signal;
 wherein the high voltage controller operates in:
  a current controlled mode wherein the DC drive signal is adjusted based on the desired output voltage set at the voltage select input and based on the feedback signals received by at least one of the actual voltage and actual current inputs;
  a voltage controlled mode wherein the DC drive signal is adjusted based on the desired load current set at the current input and based on the feedback signals received by at least one of the actual voltage and actual current inputs; and
  a combined voltage and current controlled mode wherein the DC drive signal is adjusted to achieve the desired output voltage and the desired load current set by at least one of the voltage select and current select inputs and based on the feedback signals received by at least one of the actual voltage and actual current inputs;
 wherein the DC drive signal is adjusted based on a predetermined linear relationship between at least one of the desired output voltage and the desired load current and a current value of at least one of the voltage select input and the current select input.

22. The method of claim 21 further comprising:
 adjusting at least one of an output frequency and a duty cycle of the AC drive signal based on the actual current input.

23. The method of claim 21 further comprising:
 limiting a slope of the DC drive signal based on a predefined threshold and the actual voltage input.

24. The high voltage controller of claim 9, wherein the high voltage output feedback signal and the load current feedback signal are generated at the output of the high voltage generator, wherein the high voltage output feedback signal is coupled to the actual voltage input of the high voltage controller and the load current feedback signal is coupled to the actual current input of the high voltage controller.

25. The high voltage controller of claim 1, wherein the closed loop control circuitry comprises a first error amplifier and a second error amplifier, the actual current input and the current select input being coupled to the inputs of the first error amplifier and the actual voltage input and the voltage select input being coupled to the inputs of the second error amplifier, wherein the closed loop control circuitry generates a control signal which is a sum of outputs of the first error amplifier and the second error amplifier, and wherein the first error amplifier and the second error amplifier are implemented with analog circuitry or realized in software in a microcontroller based embodiment.

* * * * *